(12) United States Patent
Tabata et al.

(10) Patent No.: US 12,206,219 B2
(45) Date of Patent: Jan. 21, 2025

(54) LIGHT SOURCE APPARATUS, TEMPERATURE DETECTION METHOD, AND SENSING MODULE

(71) Applicant: SONY SEMICONDUCTOR SOLUTIONS CORPORATION, Kanagawa (JP)

(72) Inventors: Mitsushi Tabata, Kanagawa (JP); Takashi Masuda, Kanagawa (JP); Takeshi Yuwaki, Kumamoto (JP)

(73) Assignee: SONY SEMICONDUCTOR SOLUTIONS CORPORATION, Kanagawa (JP)

( * ) Notice: Subject to any disclaimer, the term of this patent is extended or adjusted under 35 U.S.C. 154(b) by 935 days.

(21) Appl. No.: 17/250,617

(22) PCT Filed: Jul. 10, 2019

(86) PCT No.: PCT/JP2019/027287
§ 371 (c)(1),
(2) Date: Feb. 11, 2021

(87) PCT Pub. No.: WO2020/039777
PCT Pub. Date: Feb. 27, 2020

(65) Prior Publication Data
US 2021/0167572 A1    Jun. 3, 2021

(30) Foreign Application Priority Data
Aug. 22, 2018 (JP) .................... 2018-155184

(51) Int. Cl.
*G01C 3/08* (2006.01)
*G01S 7/481* (2006.01)
(Continued)

(52) U.S. Cl.
CPC ............ *H01S 5/024* (2013.01); *G01S 7/4815* (2013.01); *G01S 17/89* (2013.01); *H01S 5/042* (2013.01); *H01S 5/423* (2013.01)

(58) Field of Classification Search
CPC .......... H01S 5/024; H01S 5/042; H01S 5/423; G01S 7/4815; G01S 17/89
See application file for complete search history.

(56) References Cited

U.S. PATENT DOCUMENTS

2011/0243174 A1* 10/2011 Maeda ................ H01S 5/18391
372/50.1
2012/0299801 A1   11/2012 Kitano
(Continued)

FOREIGN PATENT DOCUMENTS

CN        102214896 A      10/2011
CN        105705962 A  *   6/2016  ............. G01S 7/484
(Continued)

OTHER PUBLICATIONS

International Search Report and Written Opinion of PCT Application No. PCT/JP2019/027287, issued on Oct. 15, 2019, 08 pages of ISRWO.

*Primary Examiner* — Mark Hellner
(74) *Attorney, Agent, or Firm* — CHIP LAW GROUP

(57) ABSTRACT

A light source apparatus is provided with the emission section in which a plurality of vertical-cavity surface-emitting laser light-emitting elements is arrayed, the driving circuit section that causes the plurality of light-emitting elements of the emission section to emit light, the temperature detection section that includes a plurality of temperature sensors arranged to detect the temperature of the emission section, and a control section. The control section is configured to, during an emission target period when the light-emitting elements of the emission section are driven by the driving circuit section, correct a detection value from each (Continued)

of the plurality of temperature sensors by using a correction value set for each of the temperature sensors.

14 Claims, 20 Drawing Sheets

(51) Int. Cl.
   *G01S 17/89* (2020.01)
   *H01S 5/024* (2006.01)
   *H01S 5/042* (2006.01)
   *H01S 5/42* (2006.01)

(56) References Cited

U.S. PATENT DOCUMENTS

2017/0307736 A1\* 10/2017 Donovan .............. G01S 7/4815
2018/0062345 A1    3/2018 Bills et al.

FOREIGN PATENT DOCUMENTS

| | | | | |
|---|---|---|---|---|
| CN | 109073757 A | 12/2018 | | |
| DE | 10160927 A1 \* | 12/2001 | ........... | H01S 5/4025 |
| JP | 05-50590 A | 3/1993 | | |
| JP | 2011-222548 A | 11/2011 | | |
| JP | 2012-195436 A | 10/2012 | | |
| JP | 2013-008950 A | 1/2013 | | |
| JP | 2013143759 A \* | 7/2013 | ............. | H04B 10/40 |
| JP | 2015-103727 A | 6/2015 | | |
| JP | 2019-516101 A | 6/2019 | | |
| KR | 10-2018-0128447 A | 12/2018 | | |
| WO | 2017/184336 A2 | 10/2017 | | |
| WO | 2018/044380 A1 | 3/2018 | | |

\* cited by examiner

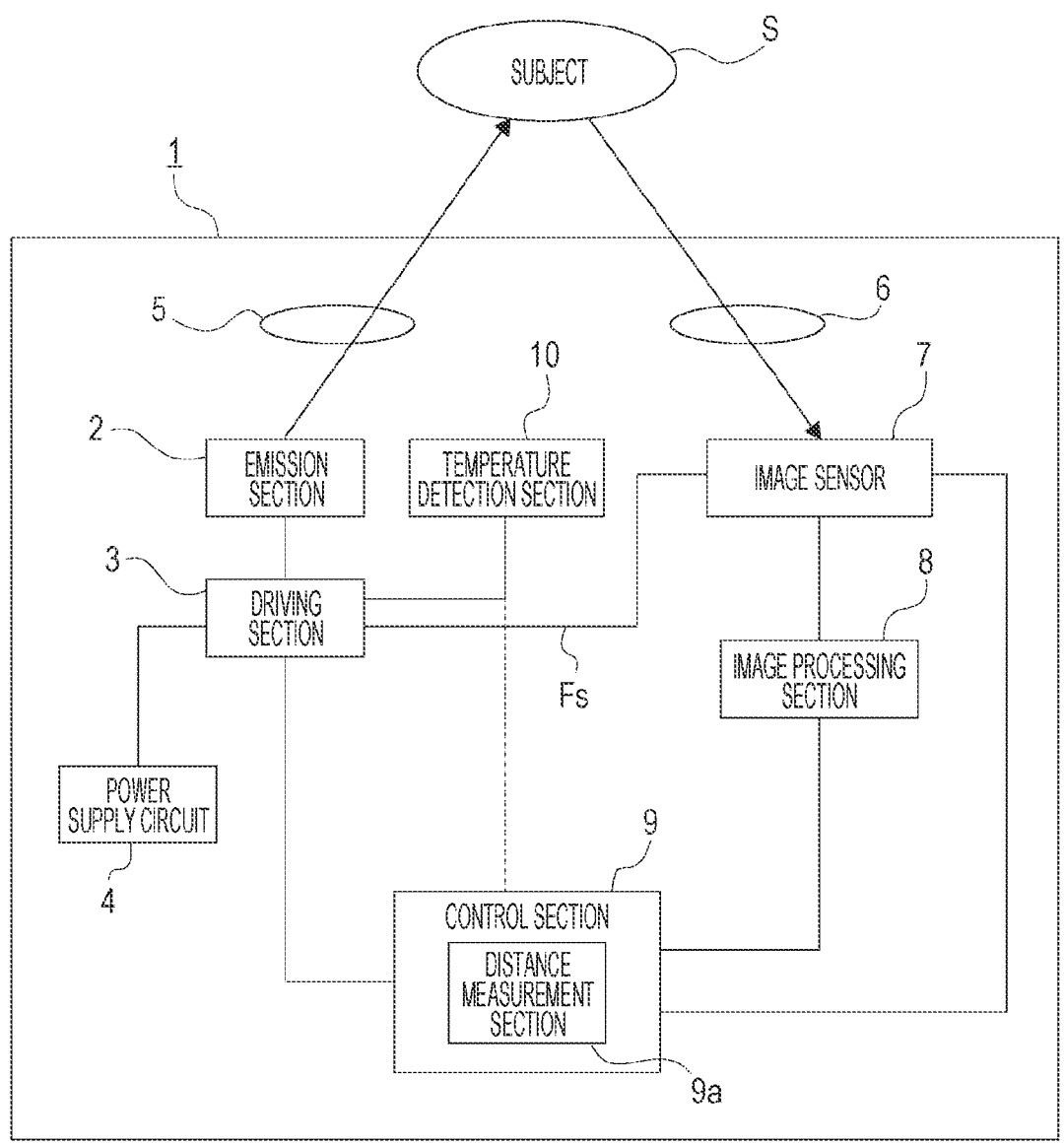

LIGHT SOURCE APPARATUS, TEMPERATURE DETECTION METHOD, AND SENSING MODULE

CROSS REFERENCE TO RELATED APPLICATIONS

This application is a U.S. National Phase of International Patent Application No. PCT/JP2019/027287 filed on Jul. 10, 2019, which claims priority benefit of Japanese Patent Application No. JP 2018-155184 filed in the Japan Patent Office on Aug. 22, 2018. Each of the above-referenced applications is hereby incorporated herein by reference in its entirety.

TECHNICAL FIELD

The present technology relates to a light source apparatus provided with an emission section in which a plurality of vertical-cavity surface-emitting laser light-emitting elements is arrayed, a temperature detection method that detects the temperature of the emission section, and a sensing module provided with an image sensor that captures an image by receiving light that is emitted by the emission section and then reflected by a subject.

BACKGROUND ART

The vertical-cavity surface-emitting laser (VCSEL) is known as a light-emitting element that emits laser light (see Patent Literatures 1 and 2 below, for example).

A VCSEL light-emitting element is configured such that an oscillator is formed perpendicular to the semiconductor substrate surface and laser light is emitted in the perpendicular direction, and in recent years, VCSELs have been used widely as light sources when measuring the distance to a subject according to a structured light (STL) method and a time of flight (ToF) method, for example.

CITATION LIST

Patent Document

Patent Document 1: Japanese Patent Application Laid-Open No. 2012-195436
Patent Document 2: Japanese Patent Application Laid-Open No. 2015-103727

SUMMARY OF THE INVENTION

Problems to be Solved by the Invention

Here, in the case of measuring the distance to a subject according to an STL method or a ToF method, a light source in which a plurality of VCSEL light-emitting elements is disposed in a two-dimensional array is used. Specifically, the subject is illuminated with light emitted from the plurality of light-emitting elements, and the distance to the subject is measured on the basis of an image obtained by receiving reflected light from the subject.

When measuring distance in this way, the plurality of light-emitting elements is made to emit light, but the light-emitting efficiency also falls as the temperature of the light-emitting elements rises, making it necessary to detect the temperature appropriately and control the driving of the light-emitting elements accordingly.

For this reason, to be able to detect the temperature of the plurality of light-emitting elements, a temperature sensor (for example, a detecting element such as a diode that forms a temperature sensor) is disposed near each individual light-emitting element or each block of multiple light-emitting elements. However, for example, size constraints and manufacturing inconsistencies make it difficult to guarantee the absolute accuracy of the detection values obtained from the plurality of temperature sensors.

The present technology has been devised in light of the above circumstances, and an object is to enable the temperature to be detected accurately for a light source apparatus provided with an emission section in which a plurality of vertical-cavity surface-emitting laser light-emitting elements is arrayed.

Solutions to Problems

A light source apparatus according to the present technology includes an emission section in which a plurality of vertical-cavity surface-emitting laser light-emitting elements is arrayed, a driving circuit section configured to cause the plurality of light-emitting elements of the emission section to emit light, a temperature detection section including a plurality of temperature sensors arranged to detect a temperature of the emission section, and a control section configured to, when the light-emitting elements of the emission section are driven by the driving circuit section, correct a detection value from each of the plurality of temperature sensors by using a correction value set for each of the temperature sensors.

The temperature sensors are disposed near the array of light-emitting elements for example, making it possible to detect the temperature state of the plurality of light-emitting elements. At this time, it is difficult to guarantee the absolute accuracy of each temperature sensor, and consequently, the detection value from each temperature sensor is corrected using a correction value set prior to driving light emission.

In the light source apparatus according to the present technology described above, it is conceivable that the correction value is an offset value indicating a difference from a reference detection value for the detection value from each of the temperature sensors.

By setting a reference detection value that serves as a reference for the detection accuracy, and by measuring the difference (offset) from the reference detection value for the detection value from each temperature sensor, the detection value from each temperature sensor is corrected.

In the light source apparatus according to the present technology described above, it is conceivable that the correction value is computed by using the detection value of each of the temperature sensors obtained in a non-emission period during which the driving circuit section is not driving the light-emitting elements of the emission section to emit light, and a reference detection value.

In other words, the correction value (offset value) is computed by comparing the detection value from each temperature sensor when the emission section is not being driven to the reference detection value.

In the light source apparatus according to the present technology described above, it is conceivable that the temperature detection section includes a reference temperature sensor as an absolute thermometer, and the reference detection value is a detection value from the reference temperature sensor.

By disposing a single reference temperature sensor for the entire system and treating the reference temperature sensor as an absolute thermometer that serves as a reference, the reference detection value when computing the correction value is established.

In the light source apparatus according to the present technology described above, it is conceivable that the reference detection value is an average of detection values from the plurality of temperature sensors.

Instead of providing a reference temperature sensor, the average of the detection values from all temperature sensors to be corrected is obtained, for example, and the average is treated as the reference detection value.

In the light source apparatus according to the present technology described above, it is conceivable that the temperature sensors are respectively disposed underneath mesas where the light-emitting elements are formed.

In the case where light-emitting elements having a diode structure are formed as mesas, for example, a temperature sensor is disposed in correspondence with each mesa.

In the light source apparatus according to the present technology described above, it is conceivable that the driving circuit section is configured to be capable of individually driving emission operation for each predetermined unit of a plurality of the light-emitting elements.

The predetermined unit may be a unit containing a single light-emitting element, a unit containing a block of multiple light-emitting elements, or the like.

With this configuration, the emission driving current can be set to turn emission ON/OFF individually for each light-emitting element or in units of blocks acting as multiple light-emitting element groups, for example.

In the light source apparatus according to the present technology described above, it is conceivable that a method of driving the emission section by the driving circuit section is switched on the basis of a temperature detection value corrected and acquired by the control section.

The driving method is switched according to the corrected temperature detection values, such as by switching between simultaneous emission driving that causes the plurality of light-emitting elements to emit light simultaneously inside an emission target period, and time-division emission driving that causes the plurality of light-emitting elements to emit light at alternating times inside an emission target period, for example.

In the light source apparatus according to the present technology described above, it is conceivable that the emission section is configured to emit light in synchronization with a frame period of an image sensor configured to receive light emitted by the emission section and reflected by a subject.

With this arrangement, to handle the case of measuring distance by illuminating a subject with light emitted by the emission section and receiving the light with an image sensor, it is possible to cause the light-emitting elements to emit light at appropriate timings according to the frame cycle of the image sensor.

A temperature detection method according to the present technology is executed in a light source apparatus provided with the above emission section, driving circuit section, and temperature detection section, and includes correcting the detection value from each of the plurality of temperature sensors by using the correction value set for each of the temperature sensors in an emission target period during which the light-emitting elements of the emission section are driven to emit light by the driving circuit section. With this arrangement, the accuracy of the detection value from each temperature sensor is improved.

Furthermore, a sensing module according to the present technology includes the light source apparatus according to the present technology described above, and an image sensor that captures an image by receiving light that is emitted by the emission section provided in the light source apparatus and then reflected by a subject.

Action similar to the light source apparatus according to the present technology described above are also obtained by such a driving method and sensing module.

Effects of the Invention

According to the present technology, the temperature detection accuracy can be improved for a light source apparatus provided with an emission section in which a plurality of vertical-cavity surface-emitting laser light-emitting elements is arrayed.

Note that, the effect described here is not necessarily limited, and can be any effect described in the present disclosure.

BRIEF DESCRIPTION OF DRAWINGS

FIG. 1 is a block diagram of an exemplary configuration of a distance measuring apparatus including a light source apparatus according to an embodiment of the present technology.

MODE FOR CARRYING OUT THE INVENTION

Figure 2A:
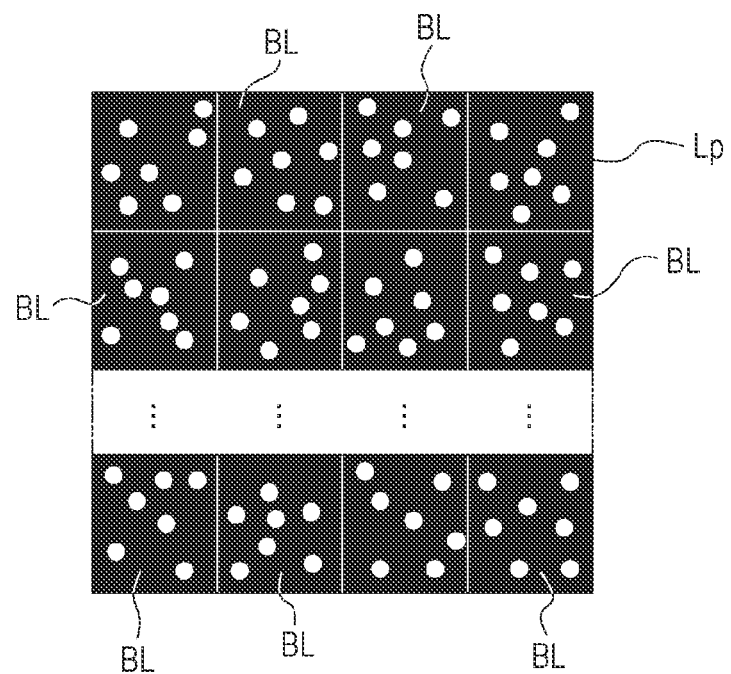
FIGS. 2A and 2B are diagrams explaining a technique of measuring distance according to a structured light (STL) method.

Hereinafter, the attached drawings will be referenced to describe embodiments according to the present technology in the following order.
<1. Configuration of distance measuring apparatus>
<2. Distance measuring techniques>
<3. Circuit configuration related to emission driving>
<4. Variations in substrate configuration>
<5. Exemplary VCSEL structure>
<6. Temperature detection section>
<7. Example of driving emission according to temperature>
<8. Temperature detection in first embodiment>
<9. Temperature detection in second embodiment>
<10. Summary and modifications>

1. Configuration of Distance Measuring Apparatus

FIG. 1 illustrates an exemplary configuration of a distance measuring apparatus 1 as an embodiment of a light source apparatus according to the present technology.

As illustrated in the diagram, the distance measuring apparatus 1 is provided with an emission section 2, a driving section 3, a power supply circuit 4, an emission-side optical system 5, an imaging-side optical system 6, an image sensor 7, an image processing section 8, a control section 9, and a temperature detection section 10.

The emission section 2 emits light from a plurality of light sources. As described later, the emission section 2 in this example includes vertical-cavity surface-emitting laser (VCSEL) light-emitting elements 2a as the light sources, and these light-emitting elements 2a are arrayed in a predetermined pattern, such as a matrix for example.

The driving section 3 includes an electrical circuit for driving the emission section 2.

The power supply circuit 4 generates a power supply voltage for the driving section 3 (a driving voltage Vd described later) on the basis of an input voltage (an input voltage Vin described later) from a source such as a battery not illustrated that is provided in the distance measuring apparatus 1, for example. The driving section 3 drives the emission section 2 on the basis of the power supply voltage.

Light emitted by the emission section 2 illuminates, through the emission-side optical system 5, a subject S treated as the target of distance measurement. Thereafter, reflected light from the subject S out of the light emitted in this way is incident on the imaging surface of the image sensor 7 through the imaging-side optical system 6.

The image sensor 7 is an image sensor such as a charge-coupled device (CCD) sensor or a complementary metal-oxide semiconductor (CMOS) sensor for example that receives reflected light from the subject S incident through the imaging-side optical system 6 as above, and converts the received light to output an electrical signal.

The image sensor 7 executes processes such as a correlated double sampling (CDS) process and an automatic gain control (AGC) process on the electrical signal obtained by photoelectric conversion of the received light, and furthermore performs an analog/digital (A/D) conversion process. An image signal is then output as digital data to the image processing section 8 downstream.

Additionally, the image sensor 7 in this example outputs a frame synchronization signal Fs to the driving section 3. With this arrangement, the driving section 3 is capable of causing the light-emitting elements 2a in the emission section 2 to emit light at timings according to the frame cycle of the image sensor 7.

The image processing section 8 is configured as an image processor such as a digital signal processor (DSP), for example. The image processing section 8 performs various types of image signal processing on the digital signal (image signal) input from the image sensor 7.

The control section 9 is provided with an information processing device such as a microcomputer including components such as a central processing unit (CPU), read-only memory (ROM), and random access memory (RAM), or a DSP. The control section 9 controls the driving section 3 for controlling the emission operations by the emission section 2 and controls imaging operations by the image sensor 7.

The control section 9 includes functions that act as a distance measurement section 9a. The distance measurement section 9a measures the distance to the subject S on the basis of the image signal input through the image processing section 8 (that is, the image signal obtained by receiving reflected light from the subject S). The distance measurement section 9a in this example measures the distance to different portions of the subject S, thereby making it possible to identify the three-dimensional shape of the subject S.

Herein, specific techniques of measuring distance in the distance measuring apparatus 1 will be described in further detail later.

The temperature detection section 10 detects the temperature of the emission section 2. A configuration that detects temperature using a diode for example can be adopted as the temperature detection section 10.

In this example, information about the temperature detected by the temperature detection section 10 is supplied to the driving section 3, thereby enabling the driving section 3 to drive the emission section 2 on the basis of the information about the temperature.

Alternatively, as illustrated by the dashed line, information about the temperature detected by the temperature detection section 10 may be supplied to the control section 9, thereby enabling the control section 9 to control the driving section 3 on the basis of the information about the temperature to drive the emission section 2 according to the temperature.

In the present embodiment, as described later, a detection value correction process that improves the accuracy of the temperature detection by the temperature detection section 10 is performed, and this correction process (and related processes) is anticipated to be performed in the driving section 3 in one case and in the control section 9 in another case.

2. Distance Measuring Techniques

As the technique of measuring distance in the distance measuring apparatus 1, a technique of measuring distance according to a structured light (STL) method or a time of flight (ToF) method can be adopted, for example.

The STL method measures distance on the basis of an image obtained by imaging the subject S illuminated with light having a predetermined light/dark pattern, such as a dot pattern or a grid pattern, for example.

Figure 2B:
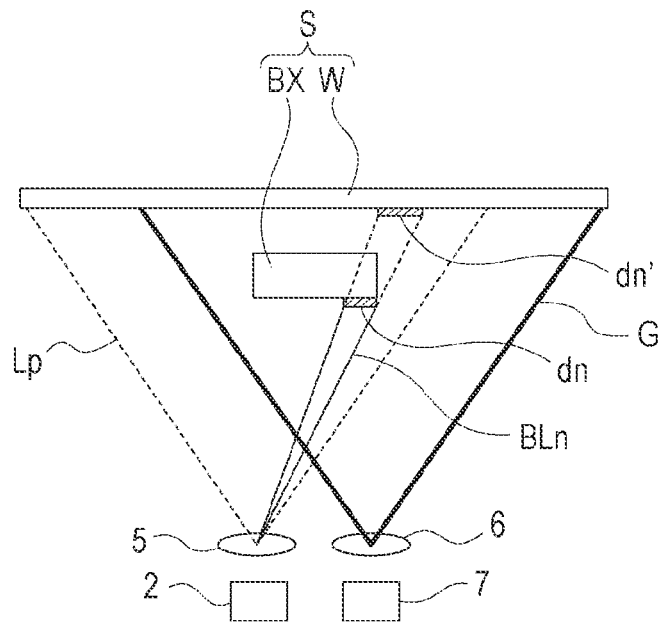

FIGS. 2A and 2B are diagrams explaining the STL method.

In the STL method, the subject S is illuminated with pattern light Lp having a dot pattern like the one illustrated in FIG. 2A, for example. The pattern light Lp is divided into a plurality of blocks BL, and a different dot pattern is assigned to each block BL (the dot patterns are not duplicated among the blocks BL).

FIG. 2B is a diagram explaining the principle of distance measurement according to the STL method.

In the example herein, a wall W and a box BX placed in front are treated as the subject S, and the subject S is illuminated with pattern light Lp. In the diagram, "G" schematically represents the angle of view of the image sensor 7.

Also, "BLn" in the diagram means the light from a certain block BL among the pattern light Lp, and "dn" means the dot pattern of the block BLn appearing in the captured image obtained by the image sensor 7.

Here, in the case where the box BX in front of the wall W does not exist, the dot pattern of the block BLn appears in the captured image at a position "dn" in the diagram. In other words, the position where the pattern of the block BLn appears in the captured image is different between the case where the box BX exists and the case where the box BX does not exist, and more specifically, a distortion in the pattern occurs.

The STL method is a method of obtaining the shape and the depth of the subject S by utilizing how the illuminating pattern is distorted by the physical shape of the subject S in this way. Specifically, the STL method is a method of obtaining the shape and the depth of the subject S from the way in which the pattern is distorted.

In the case of adopting the STL method, an infrared (IR) image sensor with a global shutter is used as the image sensor 7, for example. Additionally, in the case of the STL method, the distance measurement section 9a controls the driving section 3 such that the emission section 2 emits pattern light, and in addition, detects pattern distortion in the image signal obtained through the image processing section 8, and calculates the distance on the basis of the way in which the pattern is distorted.

Next, the ToF method measures the distance to a target by detecting the time of flight (time difference) of light that is emitted by the emission section 2, reflected by the target, and arrives at the image sensor 7.

In the case of adopting what is called the direct ToF method as the ToF method, a single-photon avalanche diode (SPAD) is used as the image sensor 7, and the emission section 2 is pulse-driven. In this case, the distance measurement section 9a calculates the time difference from emission to reception for light that is emitted by the emission section 2 and received by the image sensor 7 on the basis of the image signal input through the image processing section 8, and calculates the distance to different portions of the subject S on the basis of the time difference and the speed of light.

Note that in the case of adopting what is called the indirect ToF method (phase difference method) as the ToF method, an IR image sensor is used as the image sensor 7, for example.

3. Circuit Configuration Related to Emission Driving

Figure 3:
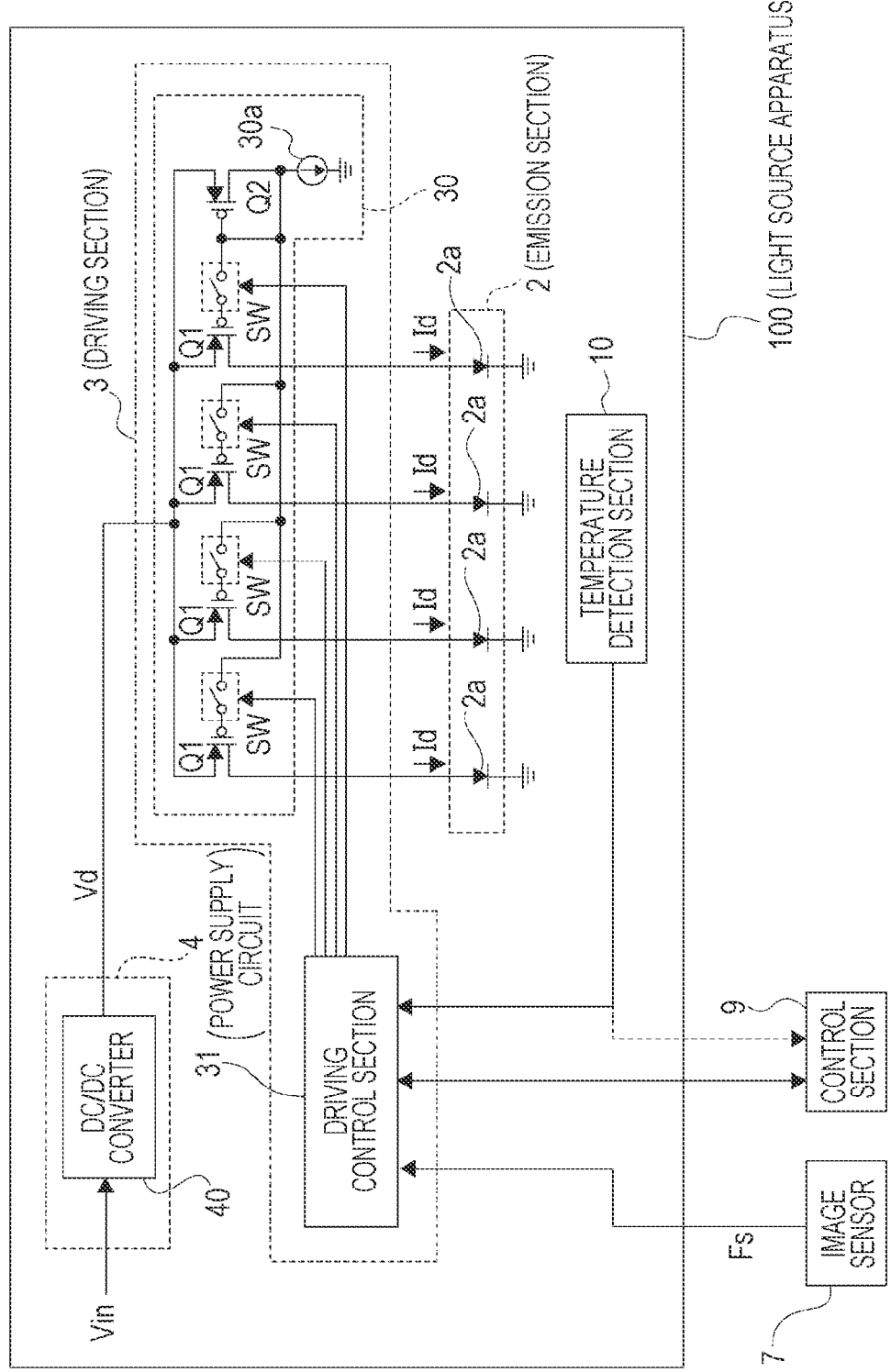
FIG. 3 is a diagram illustrating an exemplary circuit configuration of the light source apparatus according to an embodiment.

FIG. 3 illustrates an exemplary circuit configuration of a light source apparatus 100 that includes the emission section 2, the driving section 3, and the power supply circuit 4 illustrated in FIG. 1. Note that in addition to the exemplary circuit configuration of the light source apparatus 100, FIG. 3 also illustrates the image sensor 7 and the control section 9 illustrated in FIG. 1.

In this example, the emission section 2, the driving section 3, and the power supply circuit 4 are formed on a common substrate (a substrate B described later). Here, the configuration unit that includes at least the emission section 2 and is formed on a common substrate with the emission section 2 is referred to as the light source apparatus 100.

As illustrated in the diagram, the light source apparatus 100 is provided with the temperature detection section 10 in addition to the emission section 2, the driving section 3, and the power supply circuit 4.

The emission section 2 is provided with a plurality of VCSEL light-emitting elements 2a as described earlier. In FIG. 3, the number of light-emitting elements 2a is treated as "4" for convenience, but the number of light-emitting elements 2a in the emission section 2 is not limited thereto, and is sufficiently at least two or more.

The power supply circuit 4 is provided with a DC/DC converter 40, and generates a driving voltage Vd (DC voltage) that the driving section 3 uses to drive the emission section 2 on the basis of an input voltage Vin supplied as a DC voltage.

The driving section 3 is provided with a driving circuit 30 and a driving control section 31.

The driving circuit 30 includes a switching element Q1 and a switch SW for each light-emitting element 2a, as well as a switching element Q2 and a constant current source 30a.

A field-effect transistor (FET) is used for the switching element Q1 and the switching element Q2, and in this example, a P-channel metal-oxide-semiconductor (MOS) FET, or MOSFET, is used.

The switching elements Q1 are connected in a parallel relationship with respect to the output line of the DC/DC converter 40, or in other words the supply line of the driving voltage Vd, and the switching element Q2 is connected in parallel with the switching elements Q1.

Specifically, the source of each of the switching elements Q1 and the switching element Q2 is connected to the output line of the DC/DC converter 40. The drain of each switching element Q1 is connected to the anode of a corresponding light-emitting element 2a among the light-emitting elements 2a in the emission section 2.

As illustrated in the diagram, the cathode of each light-emitting element 2a is connected to ground (GND).

The drain of the switching element Q2 is connected to ground through the constant current source 30a, while the gate is connected to the node between the drain and the constant current source 30a.

The gate of each switching element Q1 is connected to the gate of the switching element Q2 through a corresponding switch SW.

In the driving circuit 30 having the above configuration, the switching elements Q1 whose switch SW is ON are electrically conductive, the driving voltage Vd is applied to the light-emitting elements 2a connected to the electrically conductive switching elements Q1, and the light-emitting elements 2a emit light.

At this time, a driving current Id flows to the light-emitting elements 2a, but in the driving circuit 30 having the above configuration, the switching elements Q1 and the switching element Q2 form a current mirror circuit, and the current value of the driving current Id is set to a value corresponding to the current value of the constant current source 30a.

By controlling the ON/OFF state of the switches SW in the driving circuit 30, the driving control section 31 controls the ON/OFF state of the light-emitting elements 2a.

The frame synchronization signal Fs is supplied to the driving control section 31 by the image sensor 7, thereby enabling the driving control section 31 to synchronize the ON timings and OFF timings of the light-emitting elements 2a with the frame cycle of the image sensor 7.

Additionally, the driving control section 31 is capable of controlling the ON/OFF state of the light-emitting elements 2a on the basis of an instruction from the control section 9.

Also, the driving control section 31 in this example controls the ON/OFF state of the light-emitting elements 2a on the basis of the temperature of the emission section 2 detected by the temperature detection section 10, but this control will be described in further detail later.

Note that, as described above, detection information from the temperature detection section 10 is supplied to the driving control section 31 or the control section 9. The temperature detection is corrected as described later, and it is necessary to store a correction value (an offset value OF described later) used for the correction.

For example, in the case where the control section 9 is configured as a microcomputer, it is sufficient to store the correction value in an internal storage area (such as a register or RAM) or an external storage element (such as RAM or flash memory).

In the case where the driving control section 31 executes the temperature detection, it is sufficient to provide the driving control section 31 with a computational function provided by a microcomputer, a DSP, a logic circuit, or the like, and also with a memory function (such as a register, RAM, or flash memory).

Figure 4:
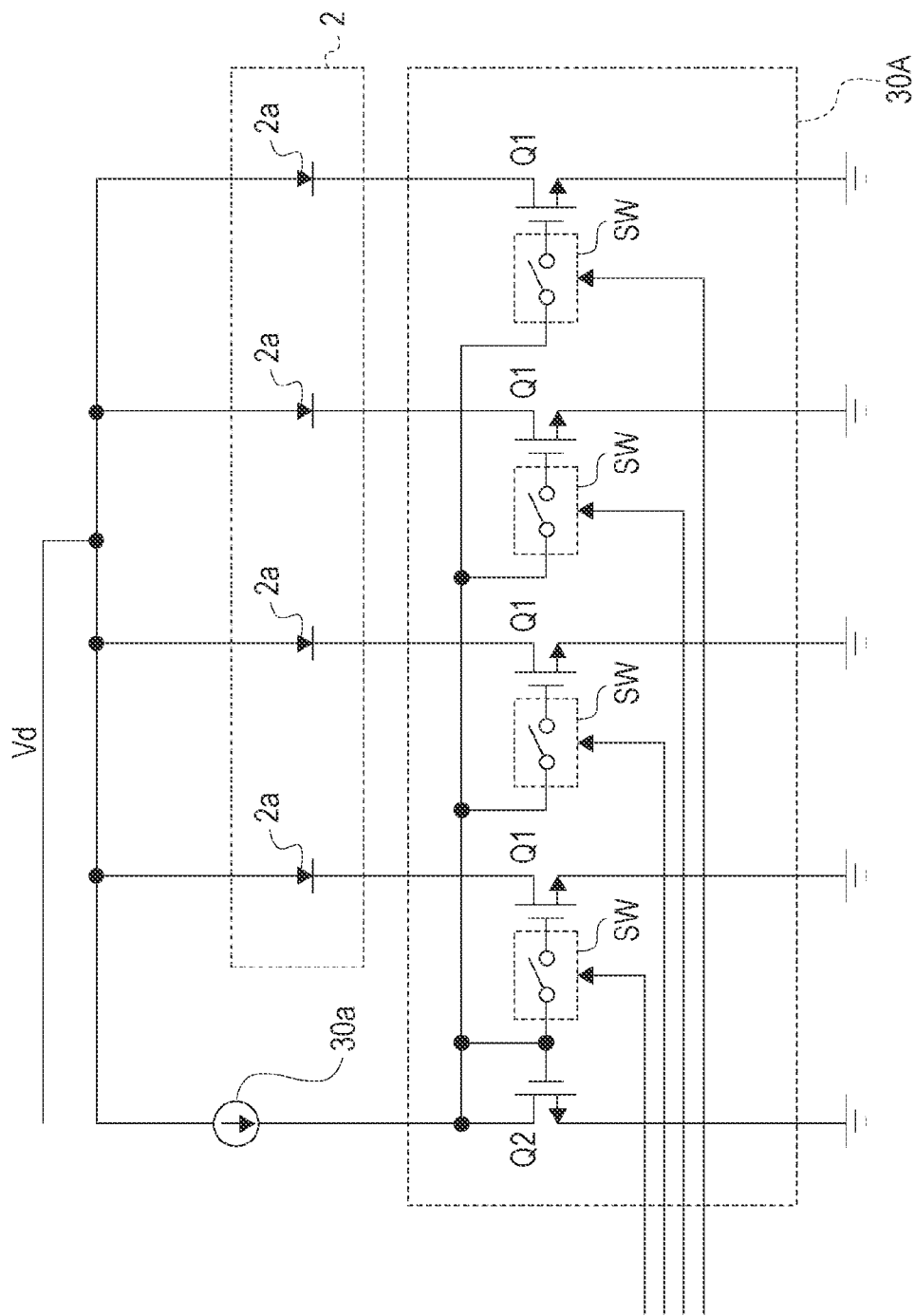
FIG. 4 is a diagram illustrating a modification of a driving circuit provided in the light source apparatus according to an embodiment.

Here, FIG. 3 illustrates an example of a configuration in which the switching elements Q1 are provided on the anode side of the light-emitting elements 2a, but like the driving circuit 30A illustrated in FIG. 4, a configuration in which the switching elements Q1 are provided on the cathode side of the light-emitting elements 2a is also possible.

In this case, the anode of each light-emitting element 2a in the emission section 2 is connected to the output line of the DC/DC converter 40.

For each of the switching elements Q1 and the switching element Q2 forming a current mirror circuit, an N-channel MOSFET is used. The drain and the gate of the switching element Q2 is connected to the output line of the DC/DC converter 40 through the constant current source 30a, while the source is connected to ground.

The drain of each switching element Q1 is connected to the cathode of the corresponding light-emitting element 2a, while the source is connected to ground. The gate of each switching element Q1 is connected to the gate and the drain of the switching element Q2 through each corresponding switch SW.

In this case as well, by controlling the ON/OFF state of the switches SW, the driving control section 31 can turn the light-emitting elements 2a ON/OFF.

Figure 5:
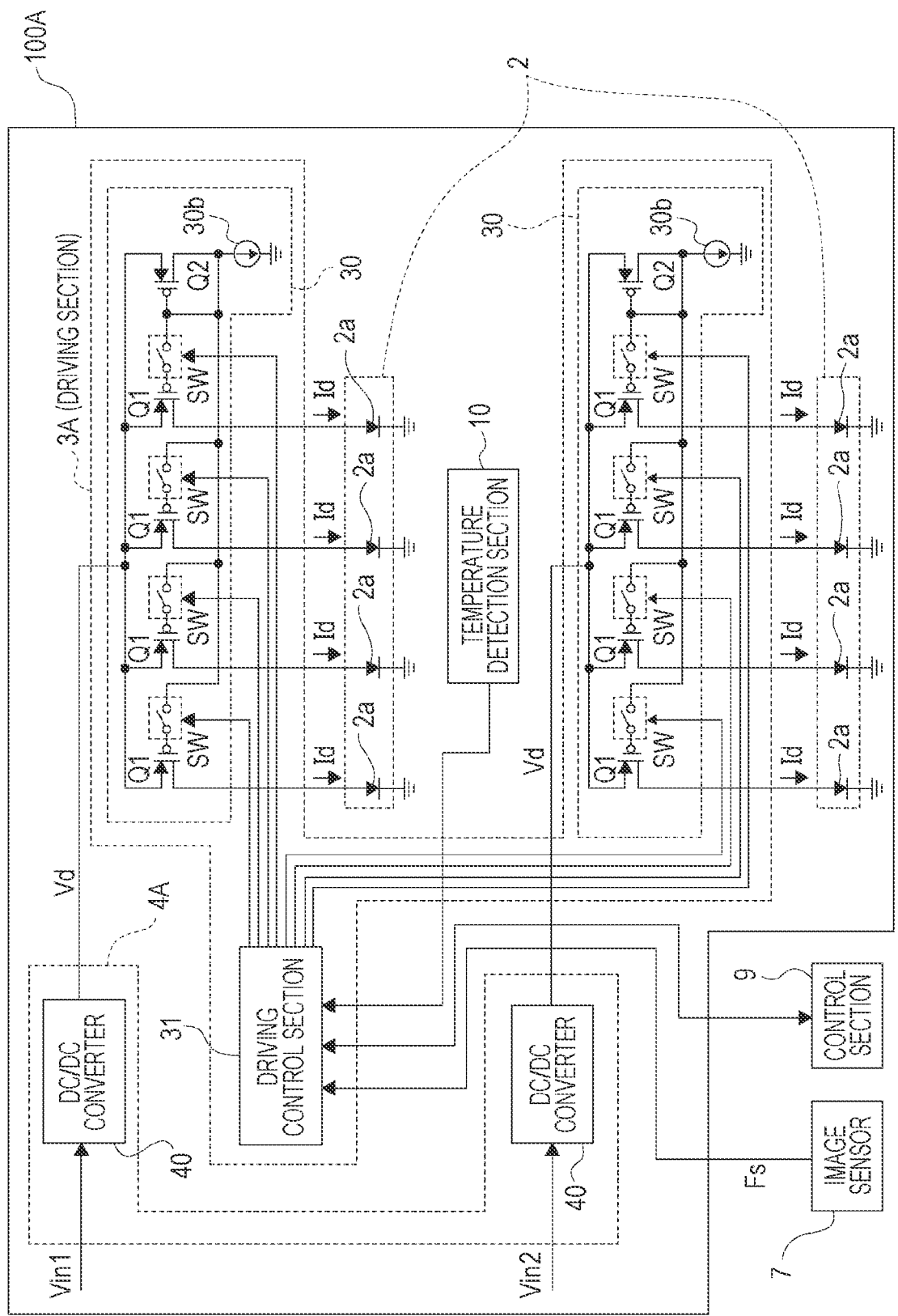
FIG. 5 is a diagram illustrating a circuit configuration as a modification of the light source apparatus according to an embodiment.

FIG. 5 illustrates an exemplary configuration of a light source apparatus 100A as a modification.

The light source apparatus 100A is provided with a power supply circuit 4A instead of the power supply circuit 4 and a driving section 3A instead of the driving section 3.

The power supply circuit 4A includes multiple (in the illustrated example, two) DC/DC converters 40. An input voltage Vin1 is supplied to DC/DC converter 40, while an input voltage Vin2 is supplied to the other DC/DC converter 40. The driving section 3A is provided with multiple driving circuits 30 that accept the input of the driving voltage Vd from the respectively different DC/DC converters 40. As illustrated in the diagram, in each driving circuit 30, a variable current source 30b is provided instead of the constant current source 30a. The variable current source 30b is a current source having a variable current value.

In this case, the light-emitting elements 2a in the emission section 2 are divided into multiple light-emitting element groups whose states are controlled ON/OFF by different driving circuits 30.

The driving control section 31 in this case controls the ON/OFF state of the switches SW in each driving circuit 30.

Like the light source apparatus 100A, by taking a configuration in which at least the pair of the DC/DC converter 40 and the driving circuit 30 are reproduced as multiple subsystems, the driving current Id of the light-emitting elements 2a can be set to a different value for each subsystem. For example, by causing the voltage value of the driving voltage Vd and the current value of the variable current source 30b to be different for each subsystem, the value of the driving current Id can be made different for each subsystem. Also, in a configuration in which the DC/DC converter 40 keeps the driving current Id constant, by making the target value of the constant current control different for each DC/DC converter 40, the value of the driving current Id can be made difference for each subsystem.

In the case of adopting a configuration like FIG. 5, it is conceivable to make the values of the driving voltage Vd and the driving current Id different for each subsystem according to factors such as the emission intensity distribution and the temperature distribution in the emission section 2. For example, it is conceivable to take measures such as increasing the driving current Id and also raising the driving voltage Vd for a subsystem corresponding to a high-temperature location in the emission section 2.

4. Variations in Substrate Configuration

Here, the light source apparatus 100 may take the configurations illustrated in FIGS. 6A, 6B, 7A, 7B, 7C, 8A, and 8B.

Figure 6A:
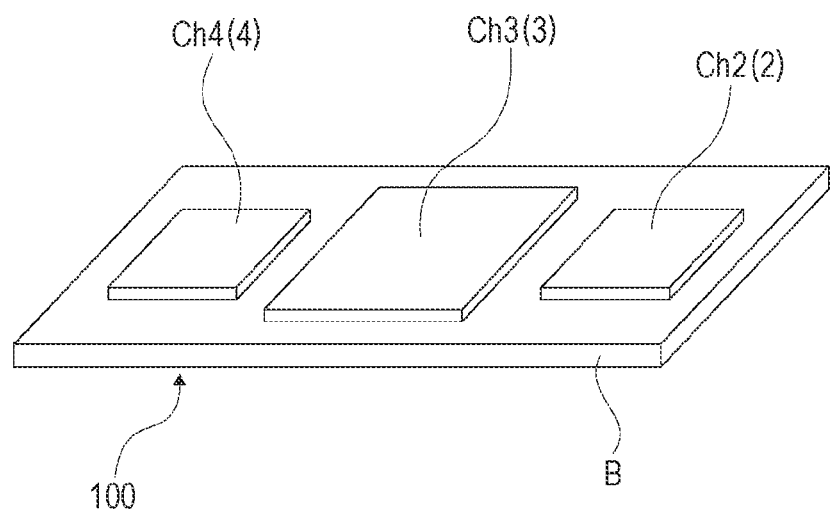
FIGS. 6A and 6B are diagrams illustrating an exemplary substrate configuration of the light source apparatus according to an embodiment.

As illustrated in FIG. 6A, the light source apparatus 100 may take a configuration in which a chip Ch2 containing a circuit that acts as the emission section 2, a chip Ch3 containing a circuit that acts as the driving section 3, and a chip Ch4 containing the power supply circuit 4 are formed on the same substrate B.

Figure 6B:
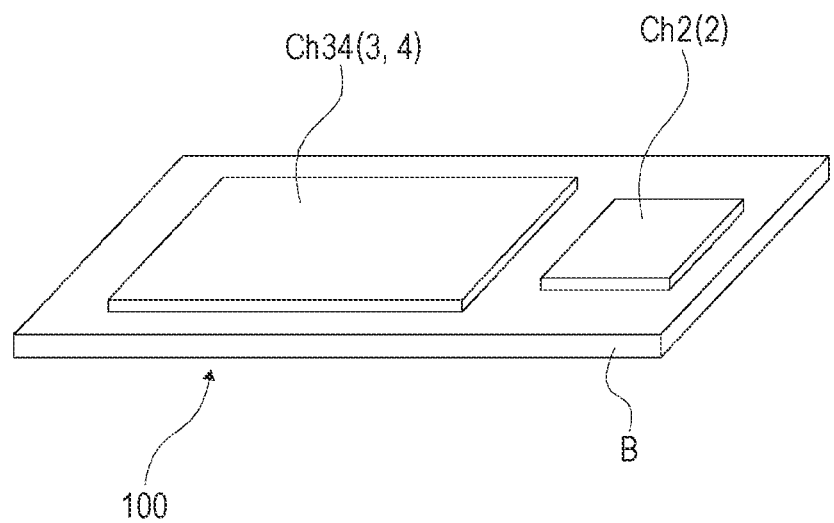

Additionally, the driving section 3 and the power supply circuit 4 may also be formed in the same chip Ch34, and in this case, the light source apparatus 100 may take a configuration in which the chip Ch2 and the chip Ch34 are formed on the same substrate B, as illustrated in FIG. 6B.

It is also possible to take a configuration in which a chip Ch is mounted on another chip Ch.

Figure 7A:
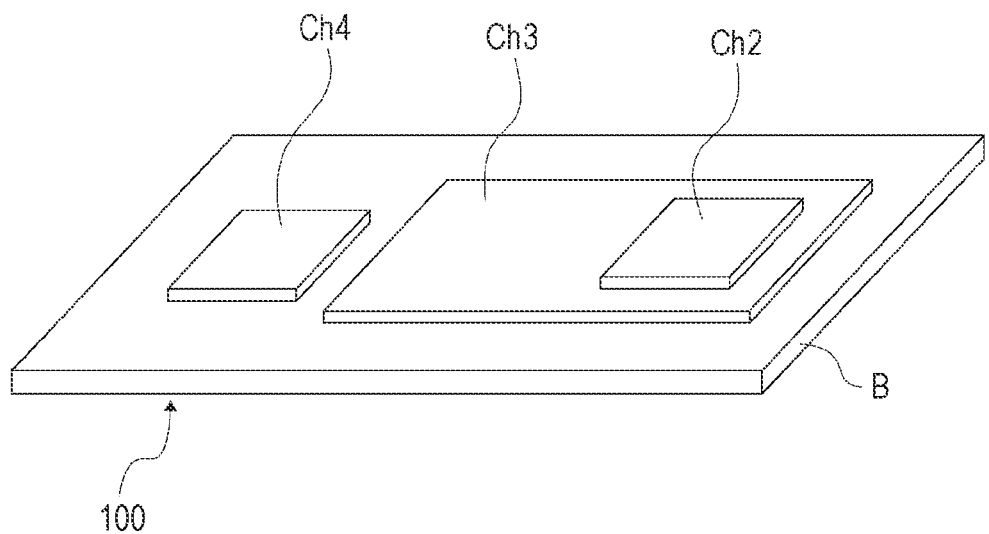
FIGS. 7A, 7B, and 7C are diagrams illustrating another exemplary substrate configuration of the light source apparatus according to an embodiment.
Figure 7B:
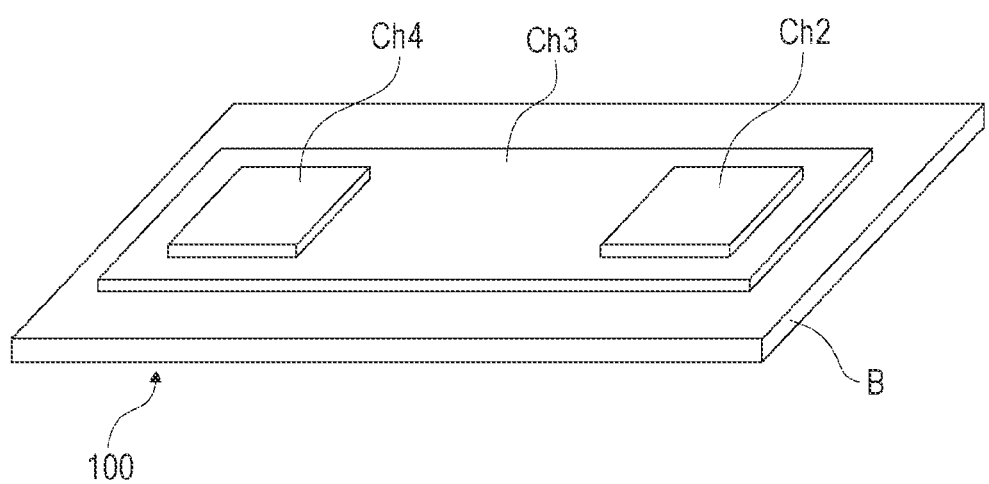
Figure 7C:
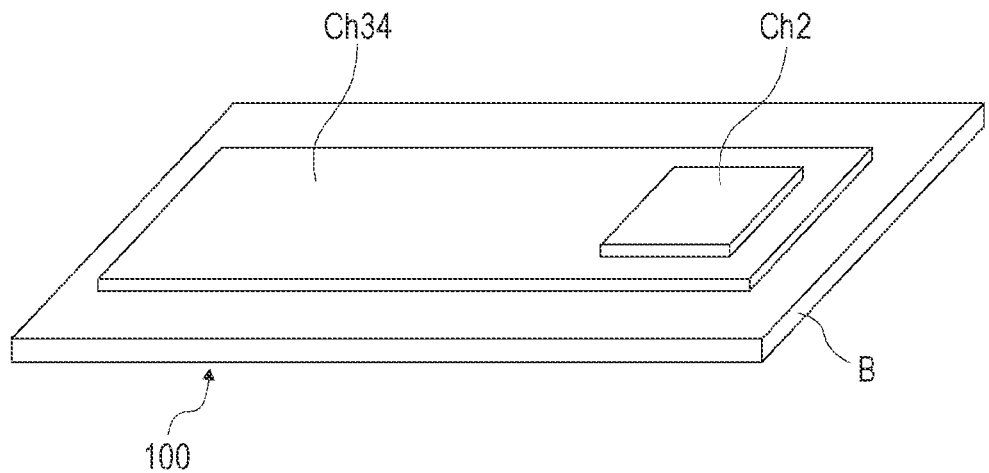

In this case, the light source apparatus 100 may take a configuration in which the chip Ch3 having the chip Ch2 mounted thereon and the chip Ch4 are formed on the substrate B like in FIG. 7A, a configuration in which the chip Ch3 having the chip Ch2 and the chip Ch4 mounted thereon is formed on the substrate B like in FIG. 7B, or a configuration in which the chip Ch34 having the chip Ch2 mounted thereon is formed on the substrate B like in FIG. 7C, for example.

Additionally, the light source apparatus 100 may also take a configuration that includes the image sensor 7.

Figure 8A:
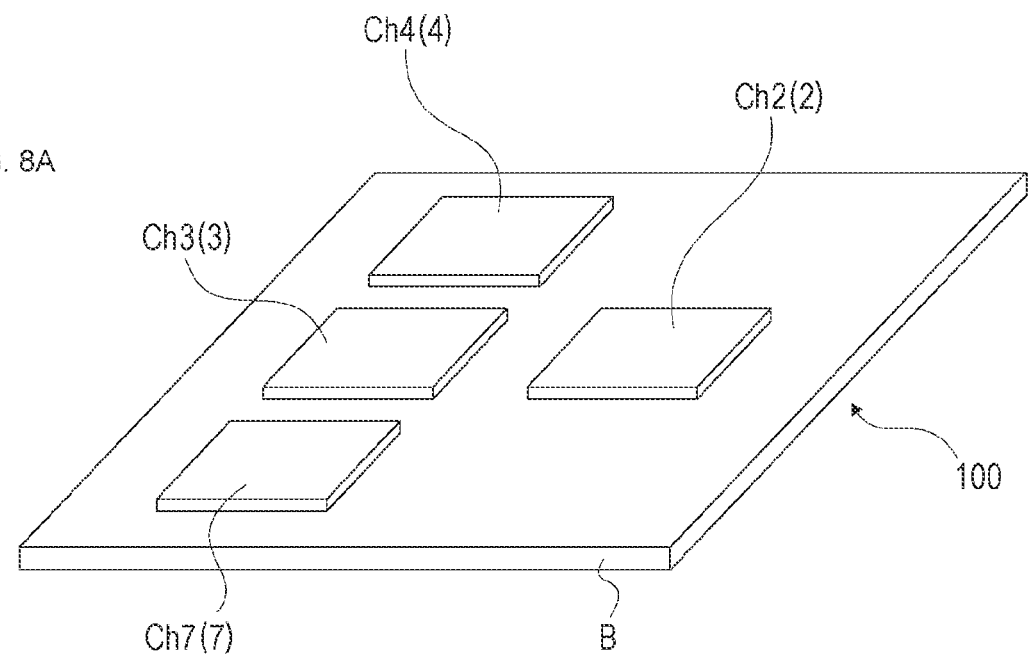
FIGS. 8A and 8B are diagrams illustrating yet another exemplary substrate configuration of the light source apparatus according to an embodiment.

For example, FIG. 8A illustrates an example of a configuration of the light source apparatus 100 in which the chip Ch2, the chip Ch3, and the chip Ch4 as well as a chip Ch7 containing a circuit that acts as the image sensor 7 are formed on the same substrate B.

Figure 8B:
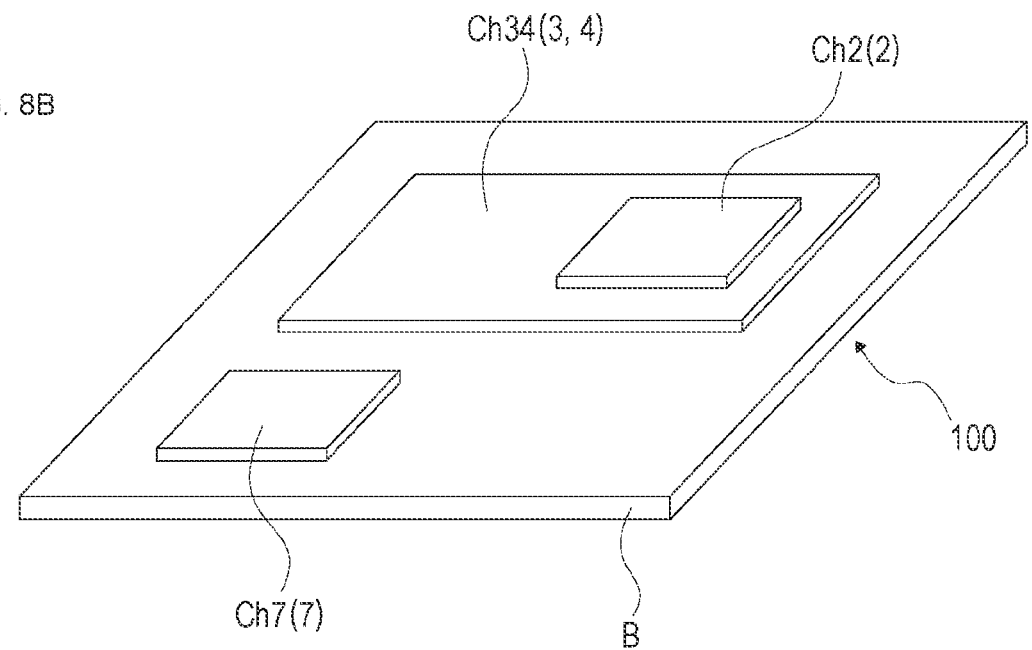

Also, FIG. 8B illustrates an example of a configuration of the light source apparatus 100 in which the chip Ch34 having the chip Ch2 mounted thereon and the chip Ch7 are formed on the same substrate B.

Note that the light source apparatus 100A described above likewise may adopt a configuration similar to those described using FIGS. 6A, 6B, 7A, 7B, 7C, 8A, and 8B.

5. Exemplary VCSEL Structure

Next, an exemplary structure of the chip Ch2 in which the emission section 2 is formed will be described with reference to FIGS. 9 and 10.

Figure 9:
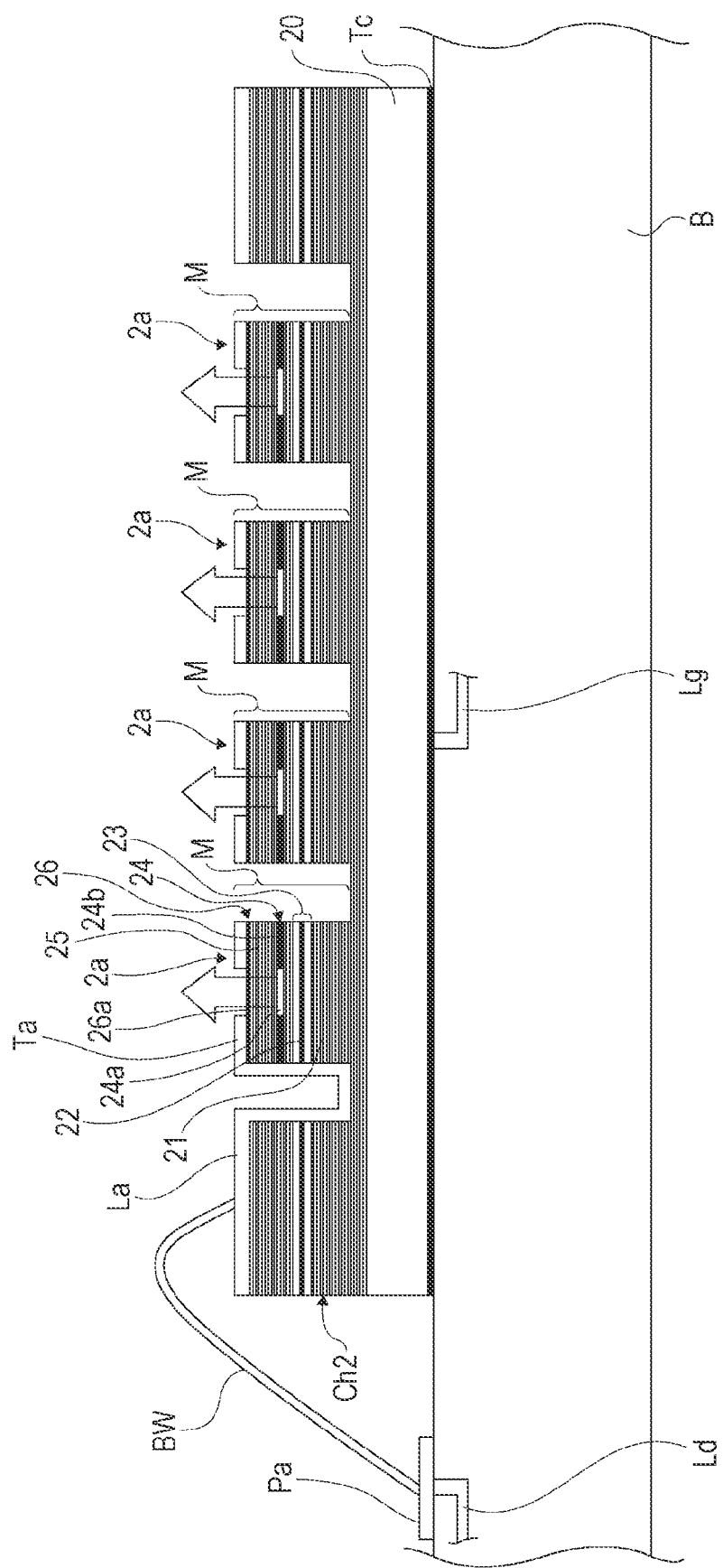
FIG. 9 is a diagram illustrating an exemplary structure of an emission section provided in the light source apparatus according to an embodiment.
Figure 10:
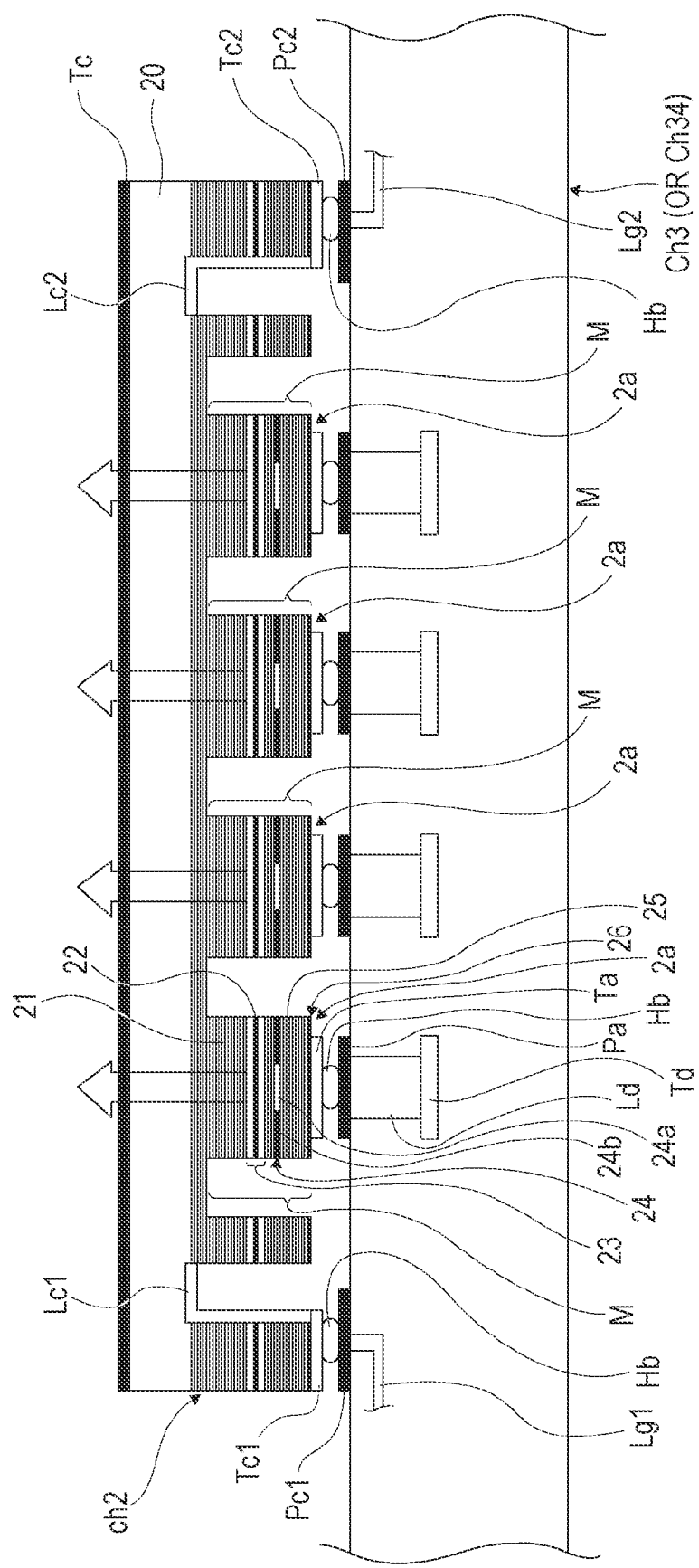
FIG. 10 is a diagram illustrating another exemplary structure of an emission section provided in the light source apparatus according to an embodiment.

FIG. 9 illustrates an exemplary structure of the chip Ch2 in the case of being formed on the substrate B like in FIGS. 6A, 6B, and 8A, while FIG. 10 illustrates an exemplary structure of the chip Ch2 in the case of being mounted onto another chip Ch like in FIGS. 7A, 7B, 7C, and B.

Note that, as an example, FIGS. 9 and 10 illustrate an exemplary structure corresponding to the case where the driving circuit 30 is inserted on the anode side of the light-emitting elements 2a (see FIG. 3).

As illustrated in FIG. 9, in the chip Ch2, the portions corresponding to each of the light-emitting elements 2a are formed as mesas M.

A semiconductor substrate 20 is used as the substrate of the chip Ch2, and a cathode electrode Tc is formed on the underside of the semiconductor substrate 20. For the semiconductor substrate 20, a gallium arsenide (GaAs) substrate is used, for example.

On the semiconductor substrate 20, in each mesa M, a first multilayer reflective layer 21, an active layer 22, a second multilayer reflective layer 25, a contact layer 26, and an anode electrode Ta are formed in order from bottom to top.

A current constriction layer 24 is formed in a part (specifically the lower part) of the second multilayer reflective layer 25. Also, the portion including the active layer 22 that is sandwiched between the first multilayer reflective layer 21 and the second multilayer reflective layer 25 acts as a resonator 23.

The first multilayer reflective layer 21 is formed using a compound semiconductor exhibiting N-type conductivity, while the second multilayer reflective layer 25 is formed using a compound semiconductor exhibiting P-type conductivity.

The active layer 22 acts as a layer for generating laser light, while the current constriction layer 24 acts as a layer that injects current efficiently into the active layer 22 and achieves a lens effect.

After the mesas M are formed, the current constriction layer 24 is subjected to selective oxidation in the unoxidized state, and includes a central oxidized region (also referred to as a selectively oxidized region) 24a and an unoxidized region 24b that is not oxidized in the periphery of the oxidized region 24a. In the current constriction layer 24, a current constricting structure is formed by the oxidized region 24a and the unoxidized region 24b, and current is conducted to the current constriction region as the unoxidized region 24b.

The contact layer 26 is provided to ensure an ohmic contact with the anode electrode Ta.

The anode electrode Ta is formed on the contact layer 26 in an annular (ring) shape or the like that is open in the center for example when looking at a plan view of the substrate B. In the contact layer 26, the portion where the anode electrode Ta is not formed on top acts as an opening 26a.

Light generated in the active layer 22 travels back and forth inside the resonator 23 and then is emitted to the outside through the opening 26a.

Here, the cathode electrode Tc in the chip Ch2 is connected to ground through a ground lead Lg formed in a wiring layer of the substrate B.

Also, in the diagram, a pad Pa represents a pad for the anode electrode formed on the substrate B. The pad Pa is connected to the drain of any one of the switching elements Q1 included in the driving circuit 30 through a lead Ld formed in the wiring layer of the substrate B.

In the diagram, the anode electrode Ta is illustrated as being connected to the single pad Pa through an anode lead La formed on the chip Ch2 and a bonding wire BW for only one light-emitting element 2a, but the pad Pa and the lead Ld are formed for each light-emitting element 2a on the substrate B, and furthermore, the anode lead La is formed for each of the light-emitting elements 2a on the chip Ch2, and the anode electrodes Ta of the individual light-emitting elements 2a are connected to the corresponding pad Pa through the corresponding anode lead La and bonding wire BW.

Figure 11B:
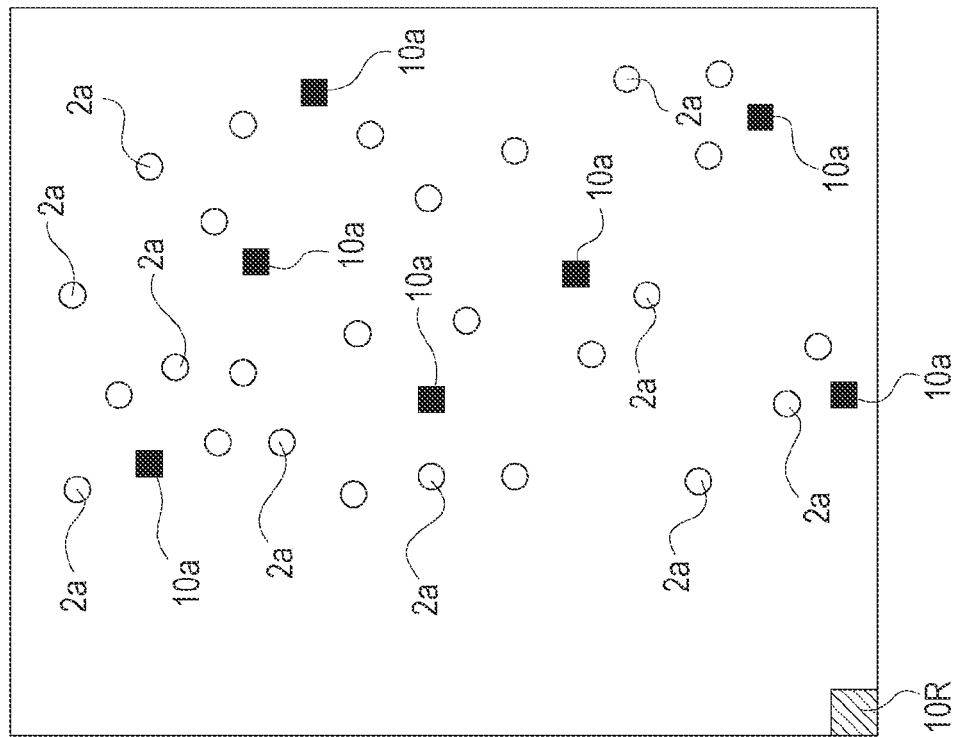
FIGS. 11A and 11B are diagrams illustrating an exemplary arrangement of temperature sensors according to a first embodiment.
Figure 11A:
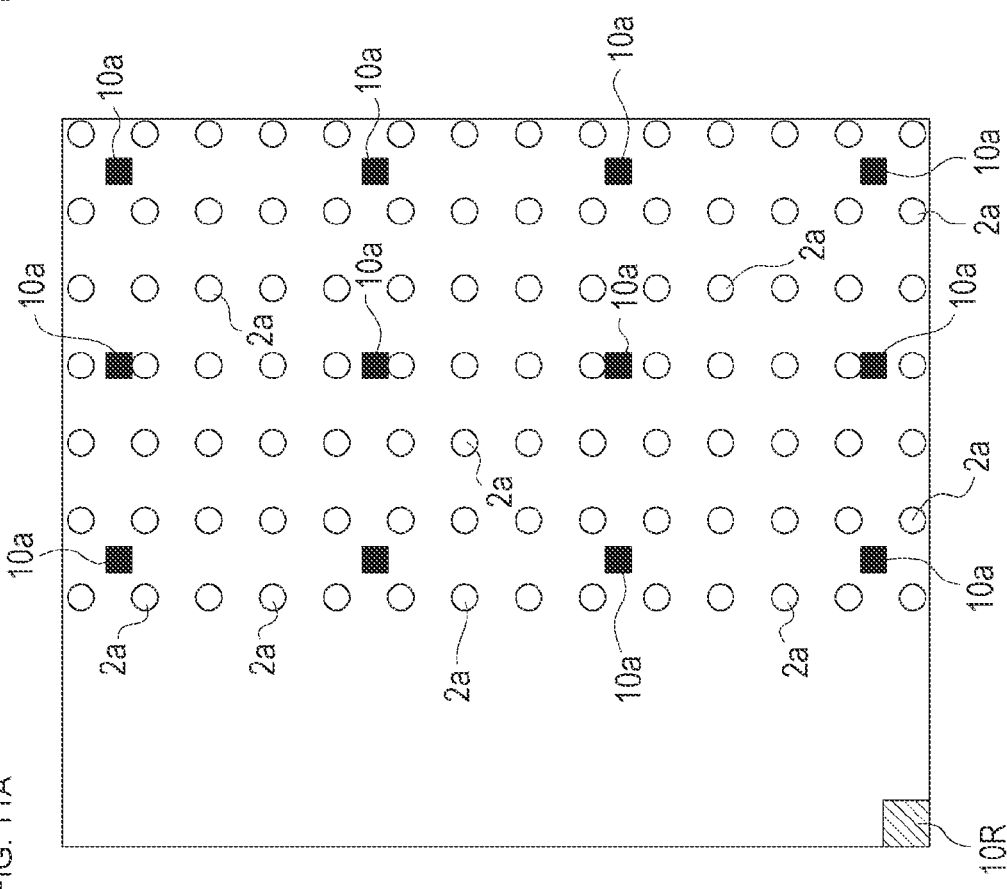

Next, in the case of FIGS. 11A and 11B, a back-illumination chip Ch2 is used as the chip Ch2. In other words, rather than emitting light in the upward direction (surface direction) of the semiconductor substrate 20 like the example in FIG. 10, a chip Ch2 of a type that emits light in the back direction of the semiconductor substrate 20.

In this case, an opening for emitting light is not formed in the anode electrode Ta, and the opening 26a is not formed in the contact layer 26.

In the chip Ch3 (or the chip Ch34; the same applies hereinafter in the description of FIGS. 11A and 11B) in which the driving section 3 (driving circuit 30) is formed, the pad Pa for establishing an electrical connection with the anode electrode Ta is formed for each light-emitting element 2a. In the wiring layer of the chip Ch3, the lead Ld is formed for each pad Pa. Although omitted from illustration, each of the pads Pa is connected, by these leads Ld, to the drain of a corresponding switching element Q1 in the driving circuit 30 formed in the chip Ch3.

Also, in the chip Ch2, the cathode electrode Tc is connected to an electrode Tc1 and an electrode Tc2 via leads Lc1 and Lc2, respectively. The electrode Tc1 and the electrode Tc2 are electrodes for respectively connecting with a pad Pc1 and a pad Pc2 formed in the chip Ch3.

In the wiring layer of the chip Ch3, a ground lead Lg1 connected to the pad Pc1 and a ground lead Lg2 connected to the pad Pc2 are formed. Although not illustrated, these ground leads Lg1 and Lg2 are connected to ground.

The connections between each anode electrode Ta in the chip Ch2 and each pad Pa in the chip Ch3 as well as the connections between the electrodes Tc1 and Tc2 in the chip Ch2 and the pads Pc1 and Pc2 in the chip Ch3 are established through respective solder bumps Hb.

In other words, the mounting of the chip Ch2 on the chip Ch3 in this case is achieved by what is called flip chip mounting.

6. Temperature Detection Section

Next, the temperature detection section 10 will be described.

In the case where the chip Ch2 is formed on the substrate B like in FIGS. 6A, 6B, and 8A for example, it is sufficient to form temperature detection elements such as diodes in the temperature detection section 10 at positions near the chip Ch2 in the substrate B (such as positions beside the chip Ch2 on the substrate B, for example).

Also, in the case where the chip Ch2 is mounted onto another chip Ch like in FIGS. 7A, 7B, 7C, and FIG. 8B, it is sufficient to form the temperature detection elements at positions near the chip Ch2 in the other chip Ch (such as positions underneath the mesas M of the chip Ch2, for example).

The temperature detection section 10 includes a plurality of temperature sensors 10a including temperature detection elements such as diodes.

FIGS. 11A and 11B illustrate exemplary arrangements of the temperature sensors 10a in the temperature detection section 10.

In the example of FIG. 11A, the plurality of temperature sensors 10a are not concentrated in a single location, but are dispersed in a plane parallel to the plane in which the light-emitting elements 2a are arrayed.

This case illustrates an example in which the VCSEL light-emitting elements 2a described above are arranged regularly in a matrix horizontally and vertically, and the temperature sensors 10a likewise are arranged regularly. In other words, the temperature sensors 10a are arranged at substantially equal intervals in a plane parallel to the plane in which the light-emitting elements 2a are arrayed.

In this case, the plurality of temperature sensors 10a is arranged such that one temperature sensor 10a is disposed for each emission block containing a predetermined number of light-emitting elements 2a, for example.

On the other hand, FIG. 11B illustrates an example in which the light-emitting elements 2a are not arranged in a matrix but instead are arranged for the purpose of forming a predetermined emission pattern, and likewise, the temperature sensors 10a are not arranged in a matrix but instead are arranged with suitable positions selected according to the arrangement of the light-emitting elements 2a.

As in FIGS. 11A and 11B, various arrangements of the light-emitting elements 2a and the temperature sensors 10a are anticipated depending on the purpose of the distance measuring apparatus 1.

Although not illustrated, there are also cases where the light-emitting elements 2a are arranged regularly in a matrix horizontally and vertically while the temperature sensors 10a are arranged in a non-matrix layout, and conversely, there are also cases where the light-emitting elements 2a are arranged in a non-matrix layout while the temperature sensors 10a are arranged regularly in a matrix horizontally and vertically.

Furthermore, it is sufficient to provide one temperature sensor 10a at a time in correspondence with a predetermined unit of one or multiple light-emitting elements 2a, and for example, one temperature sensor 10a may be provided in correspondence with one light-emitting element 2a, or one temperature sensor 10a may be provided with respect to a block of several light-emitting elements 2a. The number of light-emitting elements 2a and the number of temperature sensors 10a and the ratio of the two are considered to be diverse.

Also, by dispersing the plurality of temperature sensors 10a like in the examples of FIGS. 11A and 11B, it is possible to detect an in-plane temperature distribution of the emission section 2. In addition, different temperatures can be detected for different areas of the emission surface, and furthermore, by increasing the number of disposed temperature sensors 10a, it is also possible to detect different temperatures for different predetermined units of light-emitting elements 2a.

Here, for the process by a first embodiment described later, a reference temperature sensor 10R is disposed as illustrated in FIGS. 11A and 11B.

The reference temperature sensor 10R is considered to be disposed at a position relatively distant from the light-emitting elements 2a. However, the reference temperature sensor 10R is not necessarily stipulated to be disposed at such a position.

The reference temperature sensor 10R is used to compute a correction value (offset value OF) that corrects inconsistencies in the absolute accuracy of each of the temperature sensors 10a. Details will be described later.

Figure 12A:
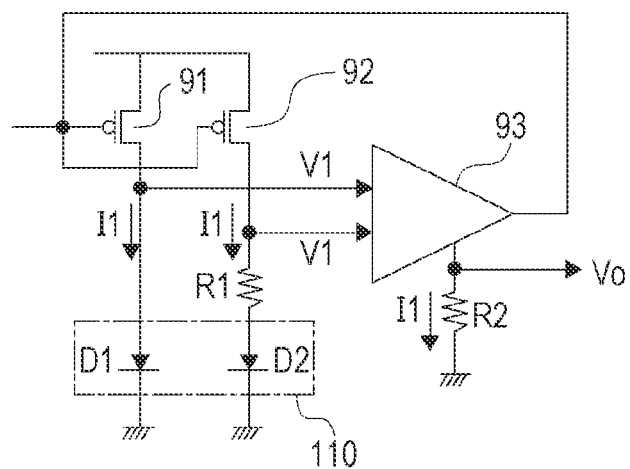
FIGS. 12A, 12B, and 12C are diagrams illustrating an exemplary circuit of a temperature sensor according to an embodiment.
Figure 12B:
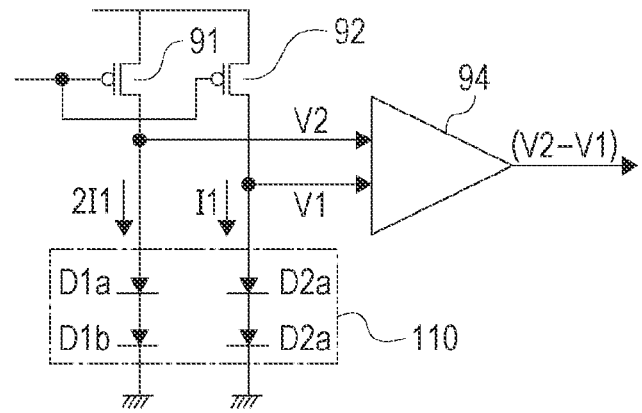
Figure 12C:
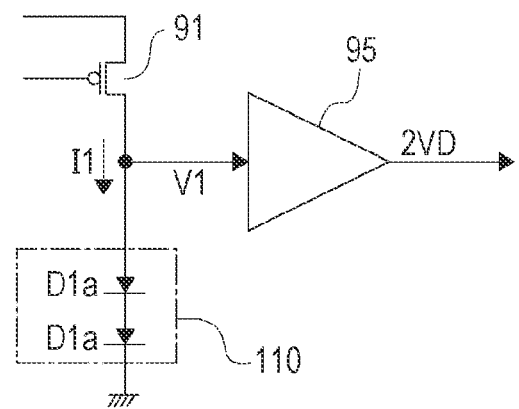

FIGS. 12A, 12B, and 12C illustrate examples of the circuit configuration of one of the temperature sensors 10a.

The example in FIG. 12A is a configuration in which a current I1 flows through FETs 91 and 92 to diodes D1 and D2 that act as a temperature detection element 110. A resistor R1 is connected between the drain of the FET 92 and the anode of the diode D2. The voltage appearing at the anode end of the diode D1 and the voltage (V1) appearing at the resistor R1 are input into an op-amp 93. The output of the op-amp 93 is connected to the gates of the transistors 91 and 92. In this case, a voltage Vo detected by a resistor R2 connected between the anode terminal of the op-amp 93 and ground is a temperature detection value corresponding to the temperature.

The example in FIG. 12B is a configuration in which currents 2I1 and I1 flow through the FETs 91 and 92 to a series connection of diodes D1a and D1b and a series connection of diodes D2a and D2b that act as the temperature detection element 110. The voltage V2 appearing at the anode end of the diode D1a and the voltage V1 appearing at the diode D2a are input into an op-amp 94. The output of the op-amp 94 is the voltage (V2-V1), and is a temperature detection value corresponding to the temperature.

The example in FIG. 12C is a configuration in which the current I1 flows through the FET 91 to a series connection of diodes D1a and D1b that act as the temperature detection element 110. The voltage V1 appearing at the anode end of the diode D1a is input into an amp 95. The output voltage 2VD of the amp 95 is a temperature detection value corresponding to the temperature.

Note that the above configurations are merely examples. Various configurations other than the above are anticipated.

Also, in FIGS. 12B and 12C, the number of diodes D is changeable if necessary. Also, in FIGS. 12A, 12B, and 12C, the current value is changeable to any value.

For example, in these examples, the portions of at least the diodes D enclosed by the dashed lines are disposed as temperature detection elements 110 at the positions of the temperature sensors 10a in FIGS. 11A and 11B.

Figure 13:
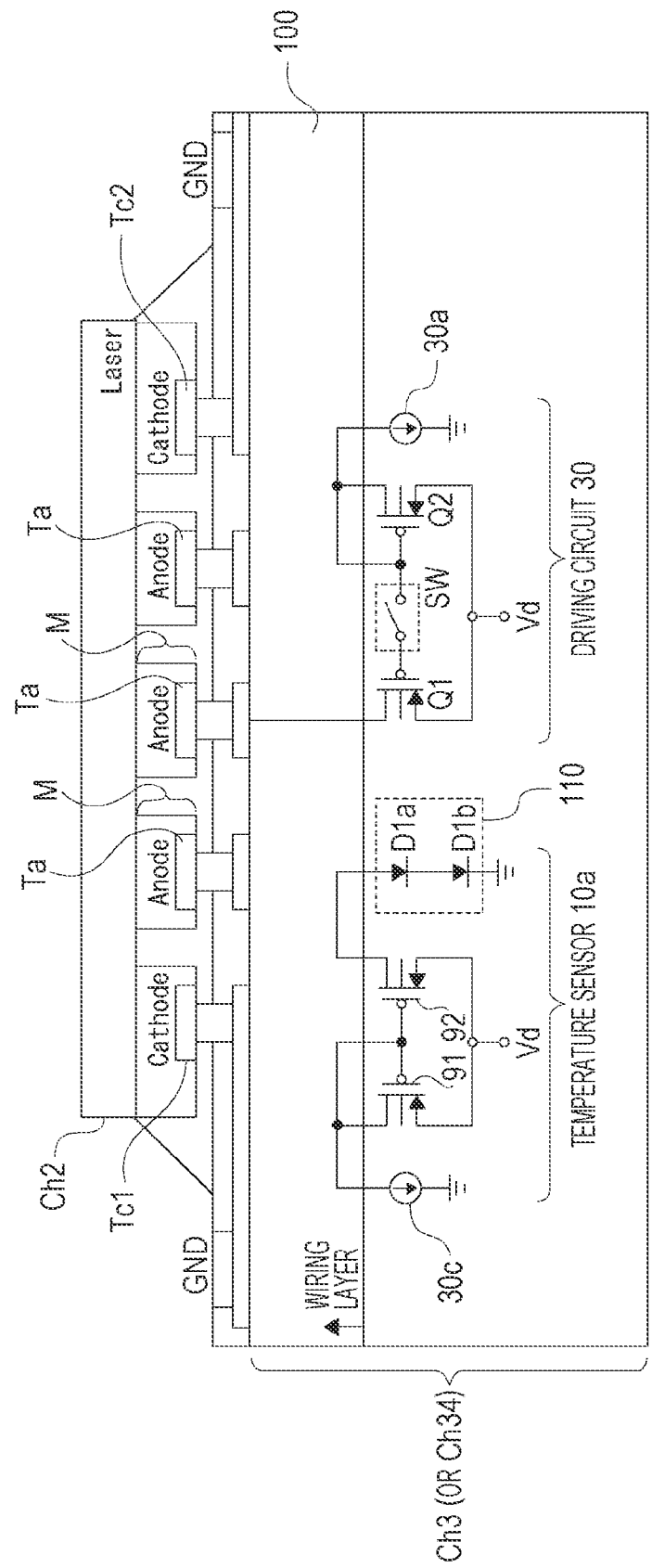
FIG. 13 is a diagram that schematically illustrates the placement of a temperature sensor according to an embodiment.

FIG. 13 illustrates the placement of one of the temperature sensors 10a in correspondence with the example of FIG. 10 earlier. In this configuration, the chip ch3 is disposed below the chip ch2 in which the light-emitting elements 2a are formed.

FIG. 13 schematically illustrates the switching elements Q1, the switches SW, the switching element Q2, and the constant current source 30a forming the driving circuit 30 illustrated in FIG. 3 earlier as being formed in the chip ch3. The leads in the driving circuit 30 are formed in a wiring layer 100.

Additionally, as illustrated in the diagram, the components of the temperature sensor 10a, such as the FETs 91 and 92, the diodes Da and D1b, and a current source 30c, for example, are formed inside the chip ch3 together with the driving circuit 30. Also, necessary leads are formed in the wiring layer 100.

Regarding the diodes D that are the temperature detection elements in the temperature sensor 10a here, various numbers of diodes and connection configurations are conceivable as illustrated in FIGS. 12A, 12B, and 12C, but the diodes D that form the configuration portion acting as the temperature detection element 110 are considered to be disposed underneath the mesas M. For example, at least one or more temperature detection elements 110 are disposed in correspondence with each mesa M. With this arrangement, it is possible to detect the temperature of the light-emitting elements 2a in each mesa M, which is suited to controlling each unit of light-emitting elements 2a in each mesa M as the predetermined unit.

Obviously, as described above, one temperature detection element 110 may also be provided with respect to one light-emitting element 2a, or one temperature detection element 110 may be provided with respect to a block of light-emitting elements 2a, irrespectively of the mesas M. In any case, the temperature detection element 110 is considered to be formed in the chip ch3 (or ch34) together with the driving circuit 30, for example.

Note that in the case where the chip ch2 is not stacked onto the chip ch3 (or ch34), it is conceivable to dispose the temperature detection elements 110 surrounding the chip ch2, provide a layer in the temperature detection elements 110 are formed underneath the chip ch2, or the like.

7. Example of Driving Emission According to Temperature

An example of driving the light-emitting elements 2a according to temperature in the case of providing the temperature sensors 10a as above will be described.

As a basic example that is anticipated, the driving current value or the emission period is changed according to the temperature.

The light-emitting elements 2a have a property in which the emission efficiency falls as the temperature rises. Accordingly, the length of the emission period and the driving current value are changed for each predetermined unit of light-emitting elements 2a corresponding to a temperature sensor 10a according to the temperature detected by the temperature sensor 10a.

With this arrangement, light emission of stable intensity can be achieved regardless of temperature.

Additionally, it is conceivable to switch the emission driving between simultaneous emission and time-division emission.

When measuring distance by causing the emission section 2 in which a plurality of VCSEL light-emitting elements 2a is arrayed to emit light like the distance measuring apparatus 1 described above, first, a driving method that causes the plurality of light-emitting elements 2a to emit light simultaneously is conceivable.

Figure 14:
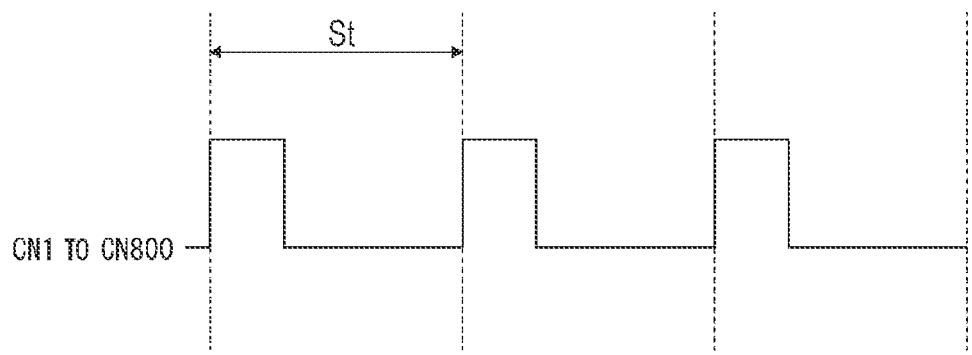
FIG. 14 is diagram explaining an example of simultaneous emission driving according to an embodiment.

FIG. 14 is a diagram for explaining an example of such driving by simultaneous emission.

As an initial premise, when measuring distance, the emission section 2 emits light repeatedly according to a fixed emission cycle. Specifically, the emission cycle is synchronized with the frame cycle of the image sensor 7. An emission target period St in the diagram is synchronized with the frame period of the image sensor 7. For example, the frame rate of the image sensor 7 is 60 fps, and the emission target period St is set to 16.6 milliseconds (ms).

Here, the following description assumes that when measuring distance, all of the light-emitting elements 2a in the emission section 2 emit light during each emission target period St. The number of light-emitting elements 2a in the emission section 2 is assumed to be 800 for the sake of explanation. In other words, there are 800 emission channels from CN1 to CN800.

In the driving method illustrated in FIG. 14, the light-emitting elements 2a from CN1 to CN800 are made to emit light simultaneously during each emission target period St. At this time, the period in which each light-emitting element 2a is made to emit light (the ON period) is shorter than the emission target period St, and is set to approximately 4 ms, for example.

In the case of performing simultaneous emission like the above, the temperature of the chip (chip Ch2) in which the light-emitting elements 2a are formed rises easily, and depending on the ambient temperature, this may lead to a heat-induced malfunction such as a drop in the emission efficiency of the light-emitting elements 2a or degraded circuit performance by the driving circuit (driving circuit 30, 30A) that drives the light-emitting elements 2a.

Accordingly, it is conceivable to drive the plurality of light-emitting elements 2a (CN1 to CN800) that are to emit light in the emission target period St according to time-division emission in the emission target period St in response to the temperature conditions.

Figure 15:
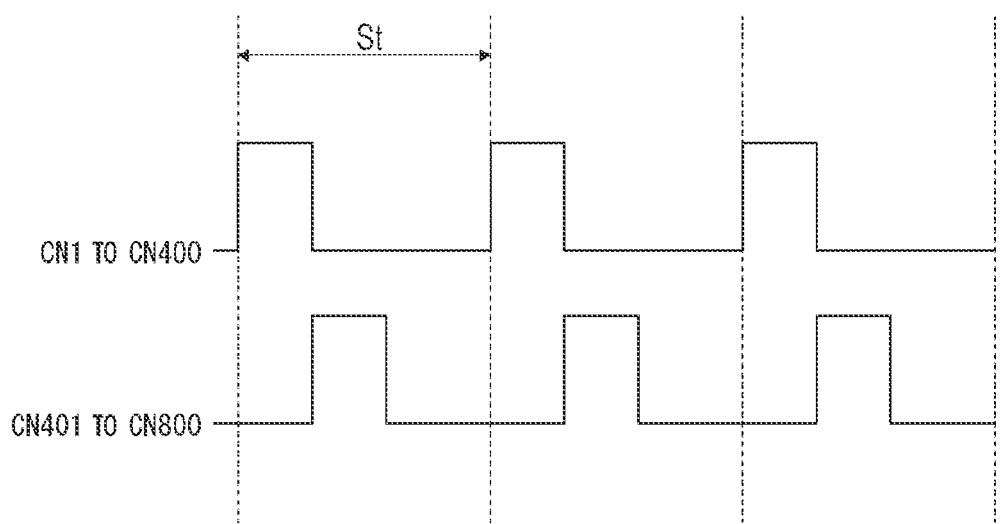
FIG. 15 is diagram explaining an example of time-division emission driving according to an embodiment.

FIG. 15 illustrates an example of time-division emission. FIG. 15 illustrates an example of dividing the light-emitting elements 2a in 800 channels that are to emit light in the emission target period St into two groups, such that inside the emission target period St, the 400 light-emitting elements 2a from CN1 to CN400 are made to emit light and then the remaining 400 light-emitting elements 2a from CN401 to CN800 are made to emit light.

Figure 16:
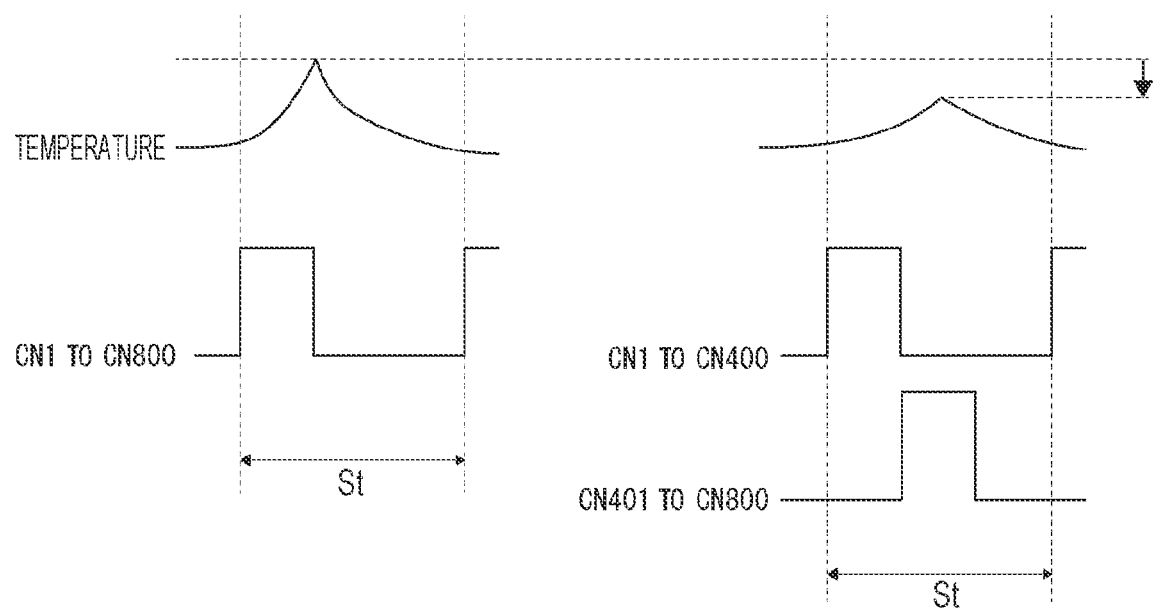
FIG. 16 is diagram for explaining the action by time-division emission driving according to an embodiment.

By performing such time-division emission, as illustrated in FIG. 16, the peak value of the temperature can be moderated compared to the case of simultaneous emission. In other words, a suppression of a rise in the temperature of the chip Ch2 may be attained.

Time-division emission like the above is achieved by having the driving control section 31 control the switches SW. In this example, the driving control section 31 includes a logic circuit, and the logic circuit is configured to control the switches SW for the above time-division emission.

As an example of time-division emission, the light-emitting elements 2a are not limited to being divided into the two groups from CN1 to CN400 and from CN401 to CN800 as above, and may also be divided into three or more groups.

At this time, the number of light-emitting elements 2a made to emit light at the same time in time-division emission may also be changed in the time direction. For example, after causing the 400 elements from CN1 to CN400 to emit light, the 200 elements from CN401 to CN600 are made to emit light, and then the remaining 200 elements from CN601 to CN800 are made to emit light. In other words, the number of light-emitting elements 2a made to emit light at the same time in time-division emission may be decreased in the time direction.

When performing time-division emission, there is a high probability that the surrounding temperature will rise for later elements in the order of emission. Consequently, by decreasing the number of light-emitting elements 2a made to emit light at the same time in the time direction as above, or in other words, by decreasing the number of light-emitting elements 2a later in the order of emission to less than the number of light-emitting elements 2a earlier in the order of emission, a suppression of the temperature peak value in the emission target period St may be attained, and the effect of suppressing the temperature rise can be enhanced.

At this point, the driving control section 31 in this example is configured to be capable of switching between simultaneous emission driving that causes the light-emitting elements 2a to emit light simultaneously as illustrated in the example of FIG. 14, and time-division emission driving that causes the light-emitting elements 2a to emit light by time division as illustrated in the example of FIG. 15. Specifically, the driving control section 31 switches between the simultaneous emission driving and the time-division emission driving on the basis of the temperature detected by the temperature detection section 10.

The drop in the emission efficiency of the light-emitting elements 2a is relatively noticeable in the region at and above 70° C., for example. For this reason, it is conceivable to set a value equal to or less than 70° C. for example as a temperature threshold TH, and switch between the simultaneous emission driving and the time-division emission driving by using the threshold TH as a reference.

Figure 17:
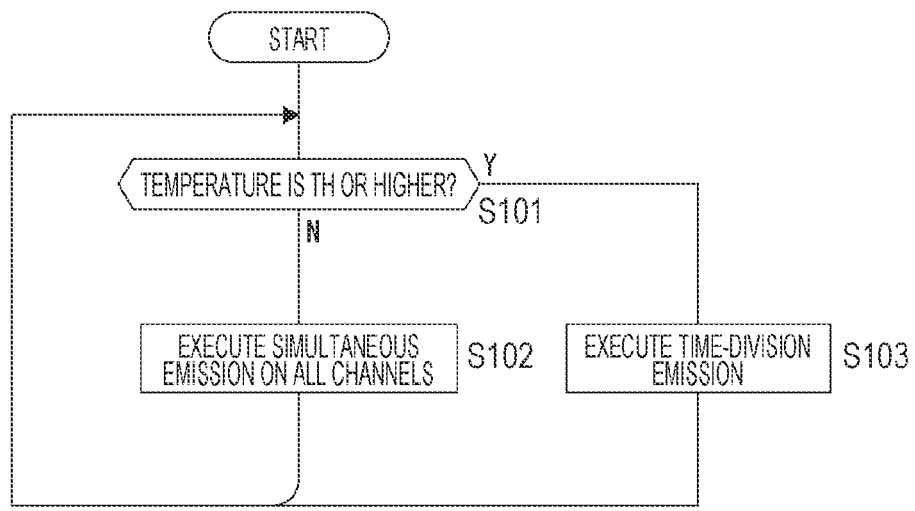
FIG. 17 is a flowchart illustrating an example of the flow of operations in the case of switching between simultaneous emission driving and time-division emission driving depending on the temperature according to an embodiment.

The flowchart in FIG. 17 illustrates an example of the flow of operations by the driving control section 31 in the case of switching between the simultaneous emission driving and the time-division emission driving according to the temperature.

As illustrated in the diagram, if the temperature detected by the temperature detection section 10 is not the threshold TH or higher (step S101: N), the driving control section 31 causes the light-emitting elements 2a in all channels to emit light simultaneously (step S102). On the other hand, if the temperature detected by the temperature detection section 10 is the threshold TH or higher (step S101: Y), the driving control section 31 causes the light-emitting elements 2a to emit light by time division (step S103).

In the embodiment herein, the temperature detection section 10 is provided with a plurality of temperature sensors 10a, and in step S101, it is conceivable to adopt a representative value of the temperature detection values from the temperature sensors 10a. Note that the temperature detection values referred to herein are the temperature detection values that have been corrected as described later.

For example, it is conceivable to use the average of the temperature detection values from the plurality of temperature sensors 10a as the representative value. Alternatively, it is also conceivable to treat a temperature detection value from a predetermined temperature sensor 10a (for example, the temperature sensor 10a having the highest temperature detection value) as the representative value.

Here, when executing the time-division emission driving, the driving control section 31 drives the light-emitting elements 2a such that the total amount of luminescence by the emission section 2 (the total amount of luminescence in the emission target period St) is the same as when executing the simultaneous emission driving. Specifically, if the ON period of each light-emitting element 2a when executing the simultaneous emission driving is 4 ms as described above, for example, the ON period of each light-emitting element 2a in the time-division emission driving is also set to 4 ms.

Note that in the case of reproducing the DC/DC converter 40 and the driving circuit 30 as multiple subsystems like the example illustrated in FIG. 5, the ON periods of the light-emitting elements 2a for each driving circuit 30 are made uniform while also making the values of the driving current Id uniform for example, thereby causing the total amount of luminescence to be the same.

By executing the simultaneous emission driving, even if there is motion in the subject S targeted for distance measurement, it is possible to prevent the combined reception of reflected light from when the subject S is at different positions inside a single frame period, and a drop in the distance measurement accuracy may be prevented.

By switching between the time-division emission driving and the simultaneous emission driving as above, both a prevention of a drop in the distance measurement accuracy and a suppression of a rise in the temperature can be attained.

Note that it is not essential to switch between the simultaneous emission driving and the time-division emission driving, and a configuration that always executes the time-division emission driving and switches the method of division according to the temperature is also conceivable.

Also, the above illustrates an example of switching the driving method for the entire plurality of light-emitting elements 2a, but the driving method may also be switched for each block of light-emitting elements 2a.

As an example, the light-emitting elements in 900 channels may be divided into blocks of 100 channels each, and the driving method may be switched between the simultaneous emission driving and the time-division emission driving in units of the 100-channel blocks.

In this case, the driving method is switched according to the temperature detected for each block (or a representative value of the temperature detection values in the case where a plurality of temperature sensors 10a are provided in correspondence with the block).

For example, in the case of simultaneous emission driving, the 100 channels are made to emit light simultaneously, while in the case of time-division emission driving, the 100 channels are divided into two groups, such that inside the emission target period St, the 50 light-emitting elements 2a from CN1 to CN50 are made to emit light and then the remaining 50 light-emitting elements 2a from CN51 to CN100 are made to emit light.

In the emission section 2, a temperature distribution occurs easily in the plane in which the light-emitting elements 2a are arranged. The temperature conditions are different depending on the location, such as the temperature rising more easily closer to the center, for example. Accordingly, by forming and controlling blocks for each location according to the temperature, more precise driving control can be achieved.

As yet another example of driving, it is conceivable to change the number of concurrent emission groups in the time-division emission according to the temperature.

Here, a concurrent emission group means a group of light-emitting elements 2a made to emit light at the same time in time-division emission. For example, in time-division emission that drives the light-emitting elements 2a in 800 channels by 400 channels at a time like the example described earlier, each group of light-emitting elements 2a in 400 channels corresponds to a concurrent emission group.

In this example, the number of concurrent emission groups is increased in response to a rise in temperature.

Figure 18:
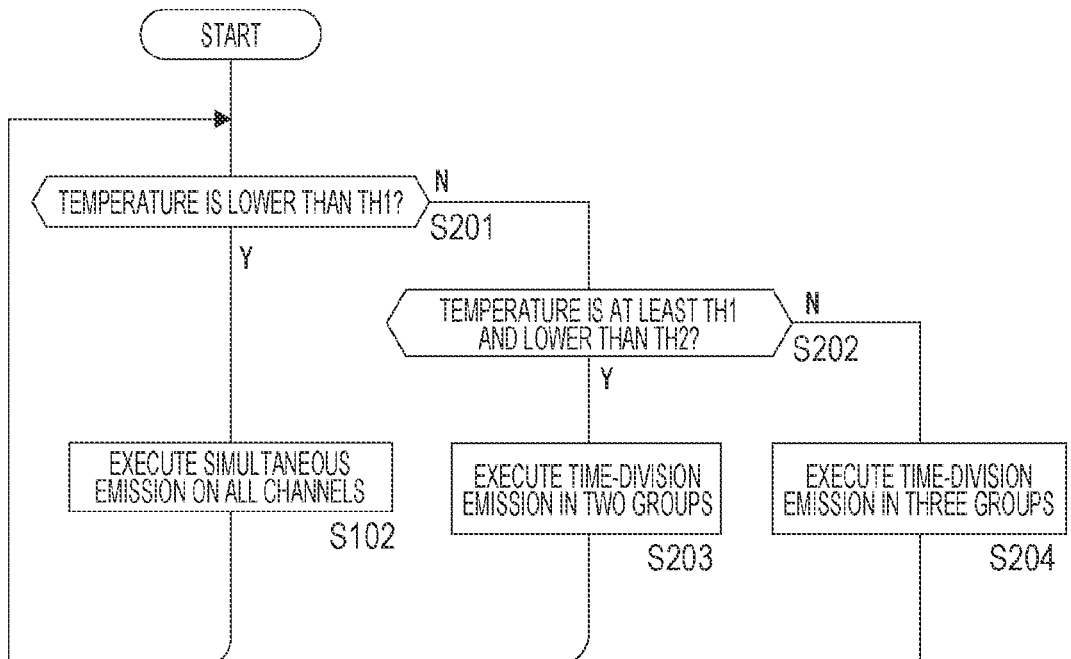
FIG. 18 is a flowchart illustrating the flow of operations in another example of driving according to an embodiment.

FIG. 18 is a flowchart illustrating the flow of operations performed by the driving control section 31.

First, in this example, a plurality of thresholds TH are set as the threshold TH of the temperature detected by the temperature detection section 10. Here, an example of setting a first threshold TH1 and a second threshold TH2 having a larger value than the first threshold TH1 is assumed.

When the temperature detected by the temperature detection section 10 is below the first threshold TH1 (step S201: Y), the driving control section 31 executes the simultaneous emission driving (step S102). Also, in the case where the temperature detected by the temperature detection section 10 is not lower than the first threshold TH1 (step S201: N), when the temperature is the first threshold TH1 or higher and also lower than the second threshold TH2 (step S202: Y), the driving control section 31 executes time-division emission in two groups (step S203). In other words, the light-emitting elements 2a are driven by time-division emission with the number of concurrent emission groups set to "2", or more specifically, time-division emission of 400 channels and 400 channels is executed, for example.

Also, when the temperature detected by the temperature detection section 10 is the second threshold TH2 or higher (step S202: N), the driving control section 31 executes time-division emission in three groups (step S204). That is to say, the light-emitting elements 2a are driven by time-division emission with the number of concurrent emission groups set to "3", or more specifically, time-division emission driving of 400 channels→200 channels→200 channels is executed, for example.

By increasing the number of concurrent emission groups in response to a rise in the temperature as above, it is possible to drive emission with a further enhanced effect of suppressing a rise in the temperature in response to the temperature increasing.

Consequently, malfunctions associated with a rise in the temperature can be made to occur less readily.

Here, the first threshold TH1 is set to the same value as the threshold TH described above (for example, approximately 70° C.), while the second threshold TH2 is set to a temperature lower than an allowable limit temperature (for example, approximately 130° C.) dictated by the specifications of the chip Ch2, for example. With this arrangement, in the case where the temperature rises enough that a drop in the emission efficiency is expected, time-division emission driving in two groups can be executed, and in the case where the temperature rises enough that the temperature is expected to reach the allowable limit temperature, time-division emission driving in three groups can be executed, or in other words, time-division emission driving with a further enhanced effect of suppressing a rise in the temperature can be executed.

In the case of such an example of driving, it is also conceivable to execute the above control independently for each predetermined unit of the light-emitting elements 2a.

Obviously, various examples of emission driving control according to the temperature besides the examples illustrated above are conceivable.

In addition, the various types of emission driving control like the above are performed on the basis of temperature detection values that have been corrected as described below.

8. Temperature Detection in First Embodiment

The emission driving control according to the temperature like the above naturally is based on the result of the temperature detection section 10 detecting the temperature. In the present embodiment, the temperature detection accuracy is improved.

Hereinafter, the temperature detection process according to the first embodiment will be described.

Note that the processes related to temperature detection described as the first and second embodiments hereinafter may be executed by the driving control section 31 or by the control section 9. For the sake of explanation, the processes are assumed to be executed by the driving control section 31, but the processes are also similar in the case of being executed by the control section 9.

Figure 19:
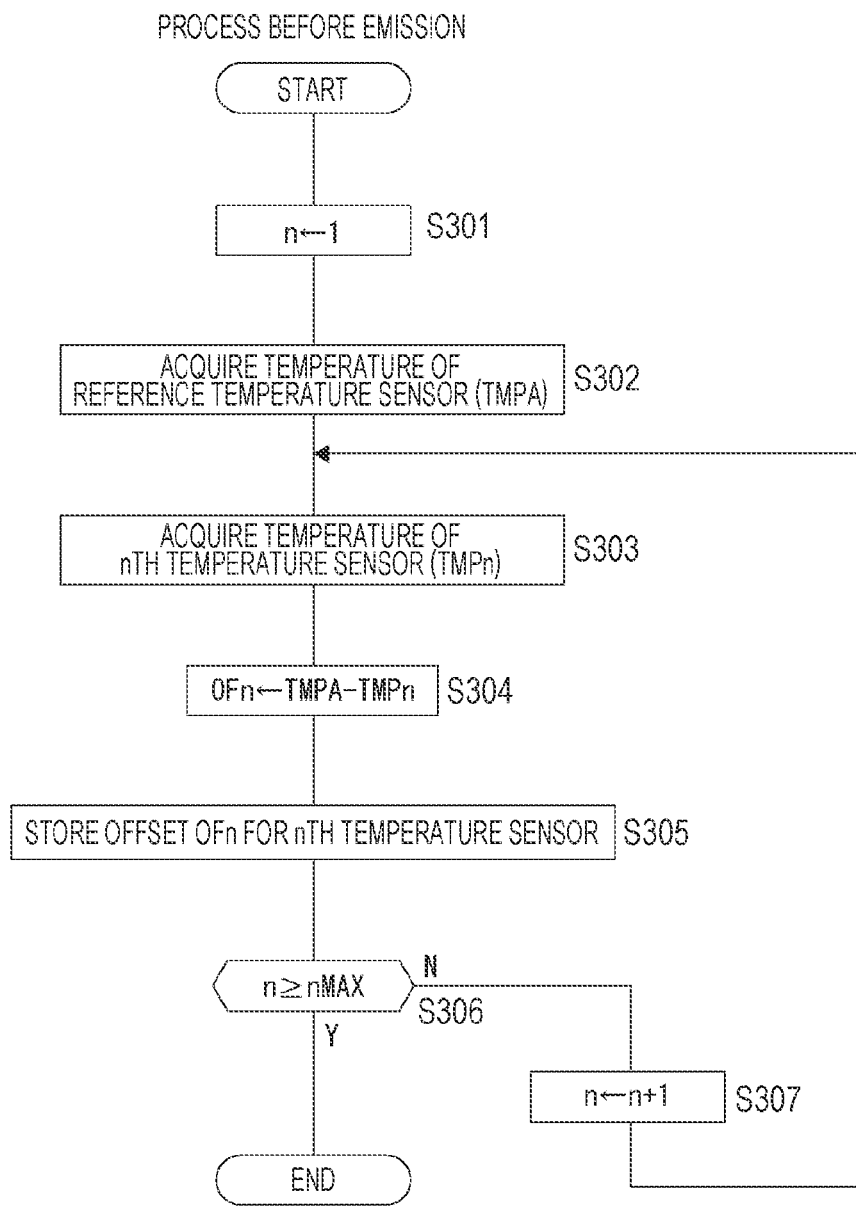
FIG. 19 is a flowchart of a pre-emission offset computation process according to the first embodiment.

FIG. 19 illustrates an example of a process before emission driving executed by the driving control section 31 as the first embodiment.

The driving control section 31 performs the process in FIG. 19 before driving the emission by the emission section 2, for example. This is a process of computing an offset value OF that acts as a correction value in correspondence with each temperature sensor 10a.

In step S301, the driving control section 31 sets a variable n=1. Here, "n" is a variable for sequentially specifying the individual temperature sensors 10a as the processing target. A total number nMAX described later is assumed to be the total number of temperature sensors 10a.

In step S302, the driving control section 31 first acquires a temperature detection value TMPA from the reference temperature sensor 10R.

In step S303, the driving control section 31 acquires a temperature detection value TMPn from the nth temperature sensor 10a. First, because the variable n=1, the temperature detection value TMP1 from the 1st temperature sensor 10a is acquired. Note that the driving control section 31 sets an order of the temperature sensors 10a from the 1st to the (nMAX)th, and the 1st temperature sensor 10a refers to the 1st temperature sensor 10a in the set order.

In step S304, the driving control section 31 computes an offset value OFn for the nth temperature sensor 10a by subtracting the temperature detection value TMPn from the temperature detection value TMPA of the reference temperature sensor 10R.

For example, the offset value OF1 for the 1st temperature sensor 10a is computed by the operation (TMPA)-(TMP1).

Thereafter, in step S305, the driving control section 31 stores the offset value OFn for the nth temperature sensor 10a in internal memory or the like. For example, the offset value OF1 for the 1st temperature sensor 10a is stored. It is also conceivable to store the offset value OFn in non-volatile memory, for example.

In step S306, the driving control section 31 checks whether or not the variable n has reached the total number nMAX, and if not, the driving control section 31 increments the variable n in step S307 and returns to step S303. In other words, a similar process is performed for each temperature sensor 10a like the 2nd temperature sensor 10a, the 3rd temperature sensor 10a, and so on, and respectively corresponding offset values OF2, OF3, and so on are computed and stored.

When the offset value OF has been stored for all of the temperature sensors 10a, the process in FIG. 19 ends after step S306.

By performing the above process before starting emission, the offset value OF for each temperature sensor 10a obtained by using the temperature detection value from the reference temperature sensor 10R as a reference can be stored.

Note that because this process obtains the offset value OF corresponding to the error in the absolute accuracy of each temperature sensor 10a, it is sufficient to perform the process at least once.

However, to absorb changes in properties due to aging and environmental changes, the process may also be performed periodically or every time the emission (that is, distance measurement) operations are executed.

Figure 20:
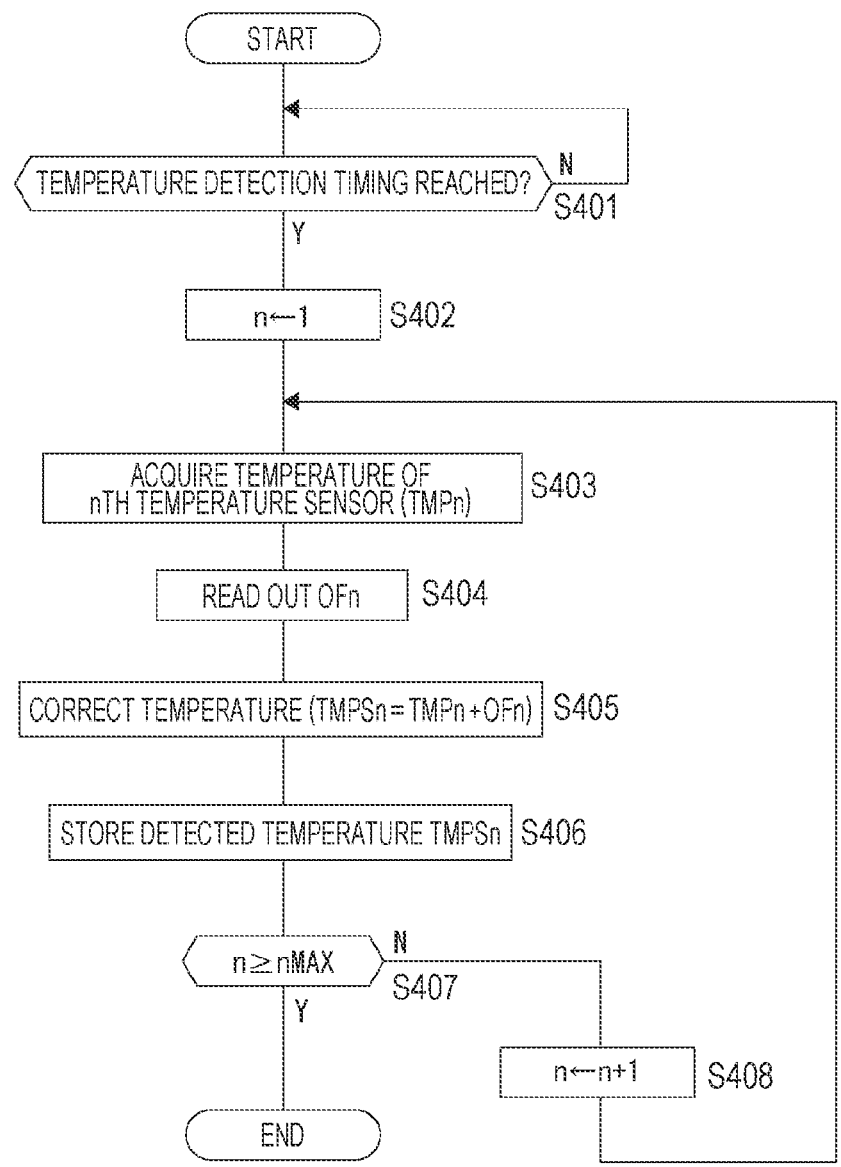
FIG. 20 is a flowchart of a temperature detection process performed during emission driving according to an embodiment.

By storing the offset value OF for each temperature sensor 10a, the driving control section 31 is able to correct and acquire temperature detection values according to the process in FIG. 20 while driving the emission by the emission section 2.

FIG. 20 illustrates an example in which the driving control section 31 executes the temperature detection at a predetermined timing, such as a periodic timing for example, while driving emission.

When the temperature detection timing is reached, the driving control section 31 proceeds from steps S401 to S402 in FIG. 20, and sets the variable n specifying the individual temperature sensors 10a to n=1.

Next, in step S403, the driving control section 31 acquires the temperature detection value TMPn from the nth temperature sensor.

In step S404, the driving control section 31 reads out the offset value OFn stored for the nth temperature sensor.

In step S405, the driving control section 31 performs temperature correction. Namely, the offset value OFn is added to the temperature detection value TMPn to obtain a corrected temperature detection value TMPSn for the nth temperature sensor 10a.

Next, in step S406, the driving control section 31 stores the corrected temperature detection value TMPSn in an internal register or the like as the temperature detection value for the nth temperature sensor 10a.

In step S407, the driving control section 31 checks whether or not the variable n has reached the total number nMAX, and if not, the driving control section 31 increments the variable n in step S408 and returns to step S403.

Consequently, corrected temperature detection values (TMPS1 to TMPS(nMAX)) are acquired by the process from step S403 to step S406 for the 1st temperature sensor 10a, the 2nd temperature sensor 10a, the 3rd temperature sensor 10a, and so on to the last temperature sensor 10a.

When temperature detection is complete for all of the temperature sensors 10a, the process in FIG. 20 ends after step S407. Thereafter, when the next temperature detection timing is reached, the process again proceeds from steps S401 to S402, and the temperature is detected similarly.

With the temperature detection results for each of the temperature sensors 10a corrected in this way, the temperature conditions of the emission section 2 can be checked accurately. By having the driving control section 31 control the emission driving method like in the examples described above according to the temperature detection results, appropriate emission operations according to the temperature are achieved.

9. Temperature Detection in Second Embodiment

The second embodiment will be described. The second embodiment is an example of a case where the reference temperature sensor 10R is not provided, as in FIGS. 21A and 21B. With regard to the arrangement of the temperature sensors 10a and the light-emitting elements 2a, various examples similar to the case described using FIGS. 11A and 11B above are conceivable.

Figure 22:
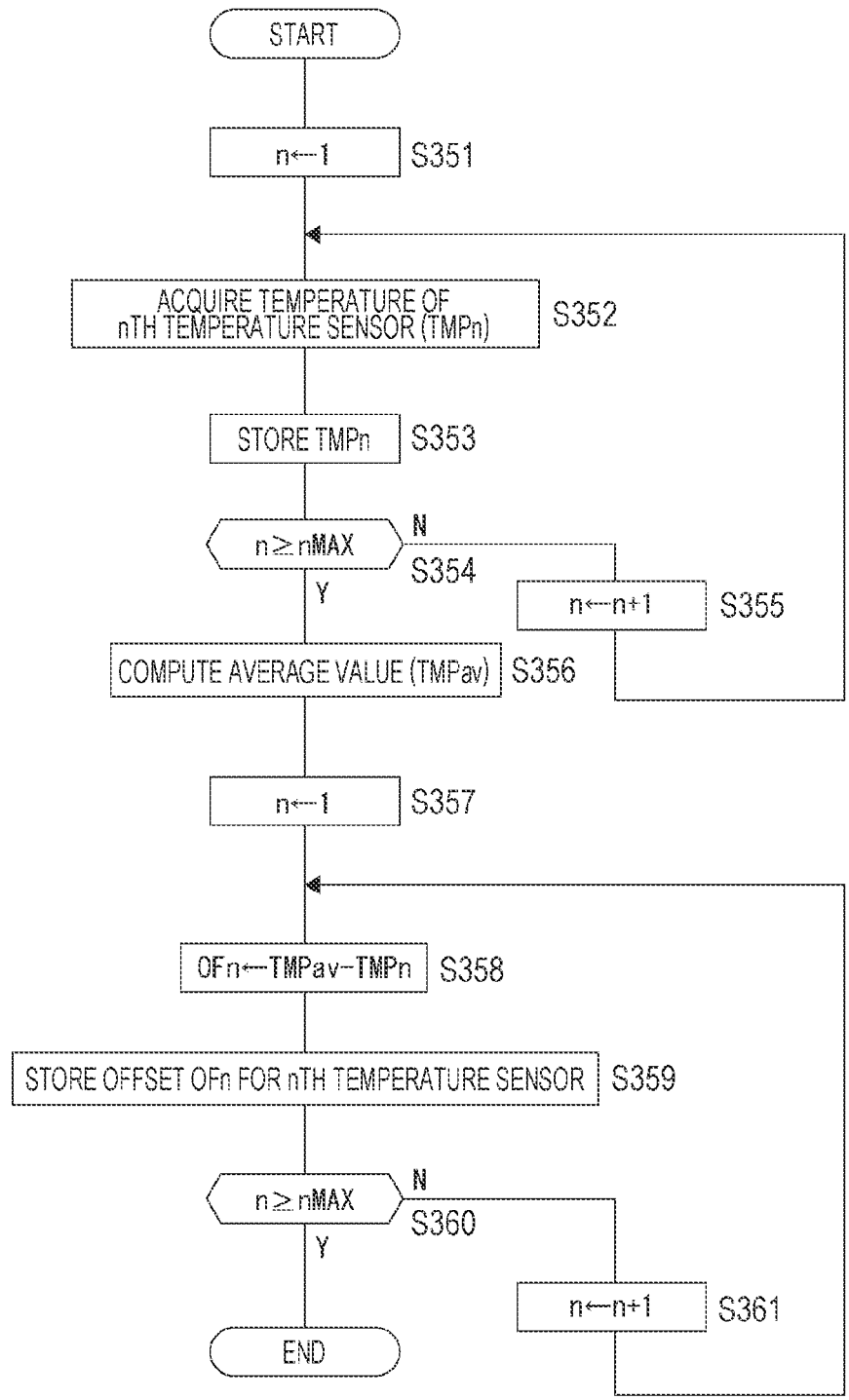

The driving control section 31 performs the process in FIG. 22 as the process of computing the offset value OF before emission.

In step S351, the driving control section 31 sets the variable n specifying the individual temperature sensors 10a to n=1.

In step S352, the driving control section 31 acquires the temperature detection value TMPn from the nth temperature sensor 10a.

In step S353, the driving control section 31 stores the temperature detection value TMPn for the nth temperature sensor 10a in an internal register or the like.

In step S354, the driving control section 31 checks whether or not the variable n has reached the total number nMAX, and if not, the driving control section 31 increments the variable n in step S355 and returns to step S352.

Consequently, detected temperature detection values TMP1 to TMP(nMAX) are acquired by the process in steps S352 and S353 for each of the 1st temperature sensor 10a, the 2nd temperature sensor 10a, the 3rd temperature sensor 10a, and so on to the last temperature sensor 10a.

When the temperature detection values TMP1 to TMP(nMAX) have been stored for all of the temperature sensors 10a, the driving control section 31 proceeds to step S356 and computes an average value TMPav of the temperature detection values TMP1 to TMP(nMAX).

Next, in step S357, the driving control section 31 sets the variable to n=1, and proceeds to step S358.

In step S358, the driving control section 31 computes the offset value OFn for the nth temperature sensor 10a. That is to say, the temperature detection value TMPn stored earlier for the nth temperature sensor 10a and the average value TMPav are used to compute the offset value OFn by (TMPav)−(TMPn).

In step S359, the driving control section 31 stores the offset value OFn for the nth temperature sensor 10a in an internal register, RAM, or non-volatile memory.

In step S360, the driving control section 31 checks whether or not the variable n has reached the total number nMAX, and if not, the driving control section 31 increments the variable n in step S361 and returns to step S358.

Consequently, offset values OF1 to OF(nMAX) are acquired by the process in steps S358 and S359 for each of the 1st temperature sensor 10a, the 2nd temperature sensor 10a, the 3rd temperature sensor 10a, and so on in order to the last temperature sensor 10a.

When the offset value OF has been stored for all of the temperature sensors 10a, the process in FIG. 22 ends after step S360.

By performing the above process before starting emission, even in the case where the reference temperature sensor 10R is not provided, the offset value OF for each temperature sensor 10a obtained by using the average value of all temperature sensors 10a as a reference can be stored.

Note that this process may also be performed at least once, but to absorb changes in properties due to aging and environmental changes, the process may also be performed periodically or every time the emission (that is, distance measurement) operations are executed.

The processing during emission, or in other words the process of correcting the temperature detection values, is similar to FIG. 20 of the first embodiment.

10. Summary and Modifications

In the above embodiment, effects like the following are obtained.

A light source apparatus (distance measuring apparatus 1) according to the embodiment is provided with the emission section 2 in which a plurality of vertical-cavity surface-emitting laser light-emitting elements 2a is arrayed, the driving circuit section 30 that causes the plurality of light-emitting elements 2a of the emission section 2 to emit light, the temperature detection section 10 that includes a plurality of temperature sensors 10a arranged to detect the temperature of the emission section 2, and a control section (the driving control section 31 or the control section 9).

When the light-emitting elements 2a of the emission section 2 are driven to emit light by the driving circuit section 30, the control section performs a process of correcting the detection value TMPn of each of the plurality of temperature sensors 10a by using a correction value set in a non-emission period for each temperature sensor 10a (see FIG. 20).

By using the correction value (offset value OF) preset for each temperature sensor to correct the detection value, a temperature detection value (corrected detection value TMPSn) guaranteeing absolute accuracy can be acquired. With this arrangement, the temperature conditions of the emission section 2 can be ascertained accurately, making it possible to perform appropriate emission driving control according to the temperature conditions.

In the embodiment, the correction value is taken to be the offset value OF indicating the difference from the reference detection value for the detection value of each temperature sensor 10a.

By measuring the offset value OF as the difference from the reference detection value in advance for use as a correction value, an appropriate correction value can be used for each of the temperature sensors 10a.

The embodiment gives an example in which the correction value (offset value OF) is computed by using the temperature detection value TMPn of each temperature sensor 10a obtained in a non-emission period during which the driving circuit section 30 is not driving the light-emitting elements 2a of the emission section 2 to emit light, and a reference detection value (see FIGS. 19 and 22).

The detection value from each temperature sensor 10a in the non-emission period during which the light-emitting elements 2a do not emit light is a detection value that is unaffected by temperature changes due to emission by the light-emitting elements 2a. Consequently, if the temperature detection value TMPn and the reference detection value are compared at this time, it is possible to obtain a correction value (offset value OF) corresponding to the accuracy inconsistencies in each temperature sensor 10a itself, including those caused by manufacturing due to factors such as the size and placement of each temperature sensor 10a. With this arrangement, each temperature sensor 10a can be corrected accurately, and the temperature detection accuracy can be improved.

The embodiment gives an example in which the temperature detection section 10 includes the reference temperature sensor 10R as an absolute thermometer, and the reference detection value is the temperature detection value TMPA from the reference temperature sensor 10R (FIG. 19).

As illustrated in FIGS. 11A and 11B, by disposing the single reference temperature sensor 10R for the entire system and treating the reference temperature sensor 10R as an absolute thermometer that serves as a reference, the reference detection value when computing the correction value is established. With this arrangement, the reference detection value is established, and the offset value OF can be computed appropriately.

The embodiment gives an example in which the reference detection value is the average value TMPav of the temperature detection values from the plurality of temperature sensors 10a (FIG. 22).

Figure 21B:
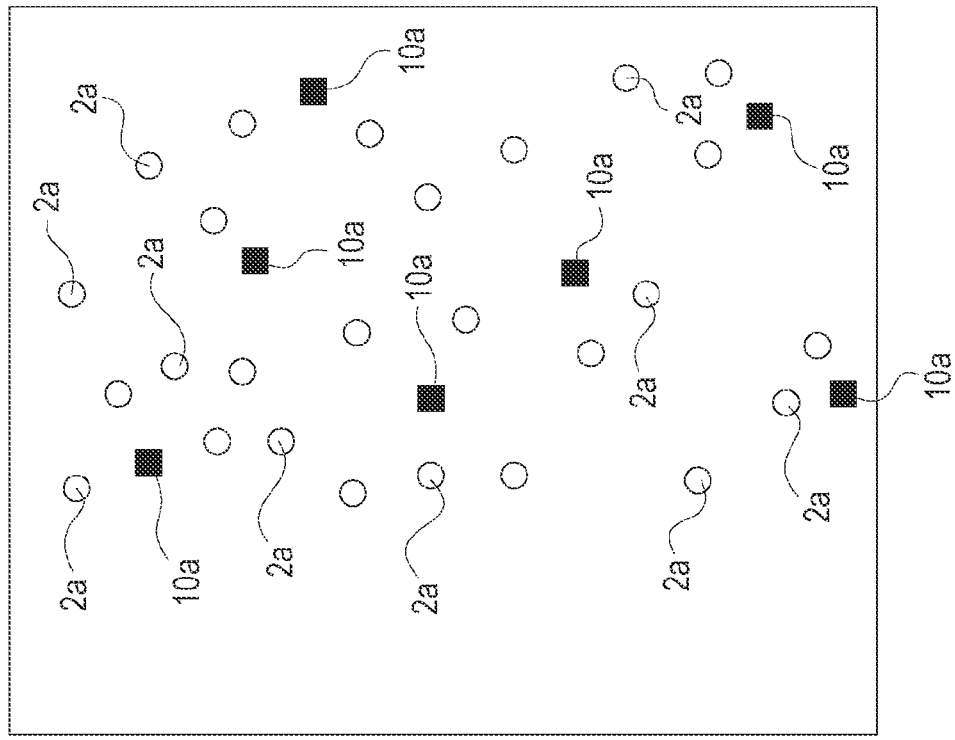
FIGS. 21A and 21B are diagrams illustrating an exemplary arrangement of temperature sensors according to a second embodiment.
Figure 21A:
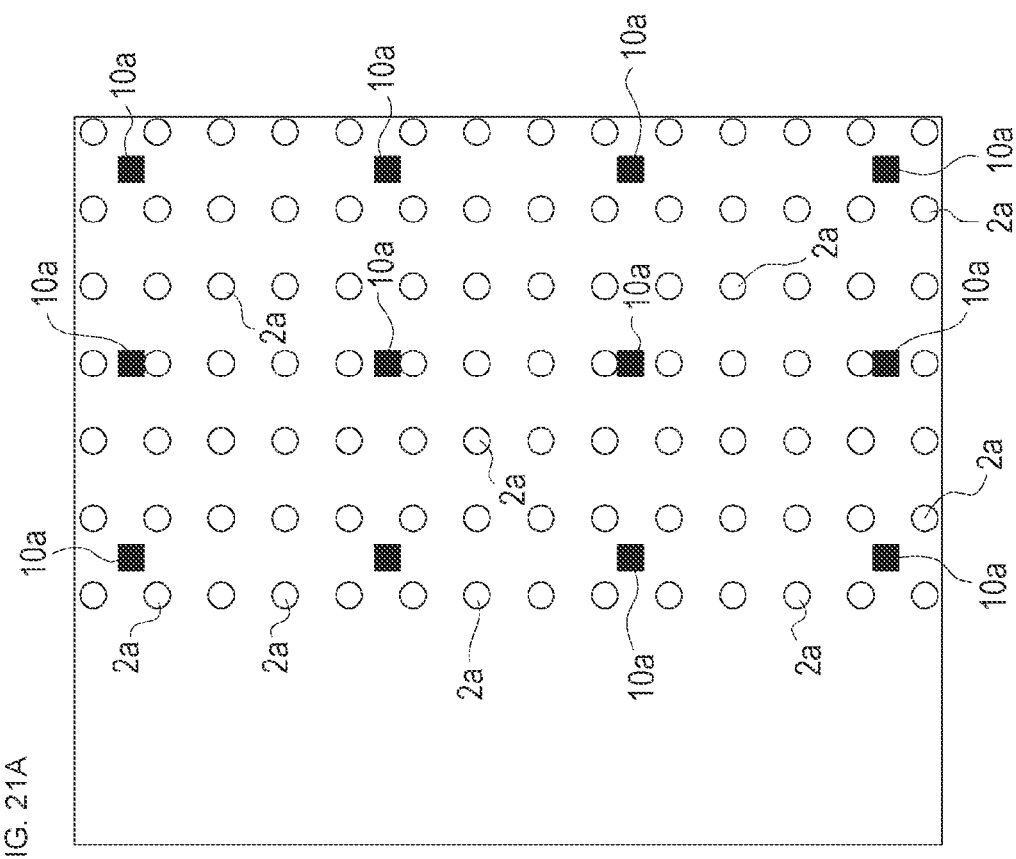

In the case where the reference temperature sensor 10R is not provided like in FIGS. 21A and 21B, the average of the temperature detection values from all of the temperature sensors 10a is obtained and treated as the reference detection value, for example.

With this arrangement, the reference detection value can be acquired without providing the absolute reference temperature sensor 10R, and the offset value OF for each temperature sensor 10a can be computed appropriately.

Note that the average value TMPav is not necessarily the average of all of the temperature sensors 10a, and may also be the average of some of the temperature sensors 10a.

The embodiment describes an example in which each temperature sensor 10a (particularly, each temperature detection element 110) is disposed underneath each mesa M where the light-emitting elements 2a are formed (see FIG. 13).

For example, in the case where the light-emitting elements 2a having a diode structure are formed as mesas, the temperature detection elements 110 of the temperature sensors 10a are arranged in correspondence with each mesa M.

With this arrangement, the temperature conditions of each mesa M can be detected, and the driving of the light-emitting elements 2a can be controlled according to the mesa temperature.

The driving circuit section 30 of the embodiment is configured to be capable of individually driving the emission operation for each predetermined unit of a plurality of the light-emitting elements 2a (see FIG. 3 and the like).

With this configuration, the emission driving current is set to turn emission ON/OFF individually for each light-emitting element or in units of blocks acting as multiple light-emitting element groups, for example.

This arrangement achieves a configuration capable of control according to the temperature conditions for each predetermined unit ascertained as the temperature detection value from each temperature sensor 10a.

Additionally, driving control according to an in-plane temperature distribution of the emission section 2 is possible.

With regard to the distance measuring sensor 1, by controlling the light-emitting elements 2a for each predetermined unit, exposure with uniform emission and light energy is possible, and the brightness of the image of reflected light from the target (subject S) appearing in the image captured by the image sensor 7 can be made to approach uniformity. With this arrangement, the distance measurement sensing accuracy is also improved.

The embodiment gives an example in which the method of driving the emission section 2 by the driving circuit section 30 is switched on the basis of the temperature detection values corrected and acquired by the control section (the driving control section 31 or the control section 9).

The driving method is switched according to the corrected temperature detection values, such as by switching between simultaneous emission driving that causes the plurality of light-emitting elements to emit light simultaneously inside an emission target period, and time-division emission driving that causes the plurality of light-emitting elements to emit light at alternating times inside an emission target period, for example.

With this arrangement, appropriate driving is achieved according to the temperature detection values obtained with high accuracy.

The switching of the driving method according to the temperature may be performed for each predetermined unit (individually or in blocks) of light-emitting elements 2a, or may be performed universally on all of the light-emitting elements 2a.

The embodiment describes an example in which the emission section 2 emits light in synchronization with the frame period of the image sensor 7 that receives light emitted by the emission section 2 and reflected by the subject.

With this arrangement, to handle the case of measuring distance by illuminating a subject with light emitted by the emission section and receiving the light with an image sensor, it is possible to cause the light-emitting elements to emit light at appropriate timings according to the frame cycle of the image sensor.

Consequently, an improvement in distance measurement accuracy may be attained. In addition, a suppression of a temperature rise in correspondence with the case where a light source apparatus is used as the light source for measuring the distance to the subject may be attained.

Note that the above describes an example of a configuration in which the switch SW is provided for each light-emitting element 2a to enable individual control of each light-emitting element 2a, but in the present technology, a configuration enabling the individual driving of each light-emitting element 2a is not essential.

Additionally, although the above describes an example in which the present technology is applied to a distance measuring apparatus, the present technology is not limited to being applied to a light source for distance measurement.

Note that the effects described in this specification are merely non-limiting examples, and there may be other effects.

Note that the present technology may be configured as below.

(1)

A light source apparatus including:
an emission section in which a plurality of vertical-cavity surface-emitting laser light-emitting elements is arrayed;
a driving circuit section configured to cause the plurality of light-emitting elements of the emission section to emit light;
a temperature detection section including a plurality of temperature sensors arranged to detect a temperature of the emission section; and
a control section configured to, when the light-emitting elements of the emission section are driven by the driving circuit section, correct a detection value from each of the plurality of temperature sensors by using a correction value set for each of the temperature sensors.

(2)

The light source apparatus according to (1), in which
the correction value is an offset value indicating a difference from a reference detection value for the detection value from each of the temperature sensors.

(3)

The light source apparatus according to (1) or (2), in which
the correction value is computed by using the detection value of each of the temperature sensors obtained in a non-emission period during which the driving circuit section is not driving the light-emitting elements of the emission section to emit light, and a reference detection value.

(4)

The light source apparatus according to (2) or (3), in which
the temperature detection section includes a reference temperature sensor as an absolute thermometer, and
the reference detection value is a detection value from the reference temperature sensor.

(5)

The light source apparatus according to (2) or (3), in which
the reference detection value is an average of detection values from the plurality of temperature sensors.

(6)

The light source apparatus according to any one of (1) to (5), in which
the temperature sensors are respectively disposed underneath mesas where the light-emitting elements are formed.

(7)

The light source apparatus according to any one of (1) to (6), in which
the driving circuit section is configured to be capable of individually driving emission operation for each predetermined unit of a plurality of the light-emitting elements.

(8)

The light source apparatus according to any one of (1) to (7), in which
a method of driving the emission section by the driving circuit section
is switched on the basis of a temperature detection value corrected and acquired by the control section.

(9)

The light source apparatus according to any one of (1) to (8), in which
the emission section is configured to emit light in synchronization with a frame period of an image sensor configured to receive light emitted by the emission section and reflected by a subject.

(10)

A temperature detection method executed by a light source apparatus including an emission section in which a plurality of vertical-cavity surface-emitting laser light-emitting elements is arrayed,
a driving circuit section configured to cause the plurality of light-emitting elements of the emission section to emit light, and
a temperature detection section including a plurality of temperature sensors arranged to detect a temperature of the emission section,
the method including:
correcting, when the light-emitting elements of the emission section are driven by the driving circuit section, a detection value from each of the plurality of temperature sensors by using a correction value set for each of the temperature sensors.

(11)

A sensing module including:
an emission section in which a plurality of vertical-cavity surface-emitting laser light-emitting elements is arrayed;
a driving circuit section configured to cause the plurality of light-emitting elements of the emission section to emit light;

a temperature detection section including a plurality of temperature sensors arranged to detect a temperature of the emission section; and a control section configured to, when the light-emitting elements of the emission section are driven by the driving circuit section, correct a detection value from each of the plurality of temperature sensors by using a correction value set for each of the temperature sensors; and an image sensor configured to capture an image by receiving light emitted by the emission section and reflected by a subject.

REFERENCE SIGNS LIST

1 Distance measuring apparatus
2 Emission section
2a Light-emitting element
3, 3A Driving section
7 Image sensor
10 Temperature detection section
10a Temperature sensor
10R Reference temperature sensor
110 Temperature detection element

The invention claimed is:

1. A light source apparatus, comprising:
an emission section comprising an array of a plurality of light-emitting elements;
a driving circuit section configured to drive the plurality of light-emitting elements of the emission section to emit light;
a temperature detection section including a plurality of temperature sensors to detect a temperature of the emission section, wherein each temperature sensor of the plurality of temperature sensors is configured to detect a temperature detection value that corresponds to the temperature; and
a control section configured to:
store, in a memory of the light source apparatus, a correction value for the temperature detection value of each temperature sensor of the plurality of temperature sensors; and
correct the temperature detection value from each temperature sensor of the plurality of temperature sensors based on the correction value stored for each temperature sensor of the plurality of temperature sensors in the memory,
wherein the correction is performed in an emission target period in which the plurality of light-emitting elements of the emission section is driven to emit the light by the driving circuit section.

2. The light source apparatus according to claim 1, wherein
the correction value is an offset value that indicates a difference between a reference detection value and the temperature detection value from each of the plurality of temperature sensors.

3. The light source apparatus according to claim 1, wherein the control section is further configured to compute the correction value based on the temperature detection value of each of the plurality of temperature sensors, and a reference detection value, and wherein the temperature detection value is detected in a non-emission period in which the driving circuit section is not configured to drive the plurality of light-emitting elements of the emission section to emit light.

4. The light source apparatus according to claim 2, wherein
the temperature detection section includes a reference temperature sensor as an absolute thermometer, and
the reference detection value is a detection value from the reference temperature sensor.

5. The light source apparatus according to claim 2, wherein
the reference detection value is an average of temperature detection values detected by the plurality of temperature sensors.

6. The light source apparatus according to claim 1, wherein
the plurality of temperature sensors is underneath mesas where the plurality of light-emitting elements is present.

7. The light source apparatus according to claim 1, wherein
the driving circuit section is configured to individually drive emission operation for each specific unit of the plurality of the light-emitting elements.

8. The light source apparatus according to claim 1, wherein the control section is further configured to switch on a driving method of the emission section by the driving circuit section based on the corrected temperature detection value.

9. The light source apparatus according to claim 1, wherein
the emission section is configured to emit the light in synchronization with a frame period of an image sensor configured to receive the light emitted by the emission section and reflected by a subject.

10. A temperature detection method for a light source apparatus that comprises
an emission section that includes an array of a plurality of light-emitting elements,
a driving circuit section configured to drive the plurality of light-emitting elements of the emission section to emit light, and
a temperature detection section including a plurality of temperature sensors to detect a temperature of the emission section, wherein each temperature sensor of the plurality of temperature sensors is configured to detect a temperature detection value that corresponds to the temperature, the method comprising:
storing, in a memory of the light source apparatus, a correction value for the temperature detection value of each temperature sensor of the plurality of temperature sensors; and
correcting the temperature detection value from each temperature sensor of the plurality of temperature sensors based on the correction value stored for each temperature sensor of the plurality of temperature sensors in the memory,
wherein the correction is performed in an emission target period in which the plurality of light-emitting elements of the emission section is driven to emit the light by the driving circuit section.

11. A sensing module, comprising:
an emission section comprising an array of a plurality of light-emitting elements;
a driving circuit section configured to drive the plurality of light-emitting elements of the emission section to emit light;
a temperature detection section that includes a plurality of temperature sensors to detect a temperature of the emission section, wherein each temperature sensor of the plurality of temperature sensors is configured to detect a temperature detection value that corresponds to the temperature;

a control section configured to:
    store, in a memory of the sensing module, a correction value for the temperature detection value of each temperature sensor of the plurality of temperature sensors; and
    correct the temperature detection value from each temperature sensor of the plurality of temperature sensors based on the correction value stored for each temperature sensor of the plurality of temperature sensors in the memory,
        wherein the correction is performed in an emission target period in which the plurality of light-emitting elements of the emission section is driven to emit the light by the driving circuit section; and an image sensor configured to capture an image based on the light emitted by the emission section and reflected by a subject.

12. The light source apparatus according to claim 1, wherein each temperature sensor of the plurality of temperature sensors includes a diode as a temperature detection element for the detection of the temperature detection value.

13. The light source apparatus according to claim 1, wherein the plurality of temperature sensors are at substantially equal intervals on a plane in correspondence with the array of the plurality of light-emitting elements.

14. The light source apparatus according to claim 8, wherein the driving method is switched between a simultaneous emission of the plurality of light-emitting elements and a time-division emission of the plurality of light-emitting elements,
    the simultaneous emission causes the plurality of light-emitting elements to emit the light simultaneously inside the emission target period, and
    the time-division emission causes the plurality of light-emitting elements to emit the light at alternating times inside the emission target period.

* * * * *